US012677695B2

(12) United States Patent
Dzyubenko et al.

(10) Patent No.: US 12,677,695 B2
(45) Date of Patent: Jul. 7, 2026

(54) LIGHT-EMITTING DEVICES WITH REINFORCEMENT MATERIALS AND RELATED METHODS

(71) Applicant: CreeLED, Inc., Durham, NC (US)

(72) Inventors: Boris Dzyubenko, Morrisville, NC (US); Christopher P. Hussell, Raleigh, NC (US); Florin A. Tudorica, Chapel Hill, NC (US)

(73) Assignee: CreeLED, Inc., Durham, NC (US)

( * ) Notice: Subject to any disclaimer, the term of this patent is extended or adjusted under 35 U.S.C. 154(b) by 678 days.

(21) Appl. No.: 17/591,791

(22) Filed: Feb. 3, 2022

(65) Prior Publication Data

US 2023/0246003 A1 Aug. 3, 2023

(51) Int. Cl.
H10K 77/10 (2023.01)
H10H 20/01 (2025.01)
(Continued)

(52) U.S. Cl.
CPC ............ H10W 90/00 (2026.01); H10H 20/01 (2025.01); H10H 20/854 (2025.01);
(Continued)

(58) Field of Classification Search
CPC ... H01L 25/0753; H01L 33/005; H01L 33/56; H01L 33/62; H01L 2933/005; H01L 2933/0066; H01L 33/58; H01L 2933/0058; H01L 33/54; H01L 33/60; H10H 20/01; H10H 20/854; H10H 20/857; H10H 20/0362; H10H 20/0364; H10H 20/0363;
(Continued)

(56) References Cited

U.S. PATENT DOCUMENTS 10,453,827 B1 10/2019 Hussell et al.
10,651,351 B1 5/2020 Hussell
(Continued)

FOREIGN PATENT DOCUMENTS

JP 2015146457 A * 8/2015
JP 2017224869 A * 12/2017 ......... H01L 25/0753
(Continued)

*Primary Examiner* — Samuel Park
(74) *Attorney, Agent, or Firm* — Withrow & Terranova, P.L.L.C.

(57) ABSTRACT

Light-emitting devices including solid-state light-emitting devices, light-emitting diodes (LEDs), and LED packages with reinforcement materials and related methods are disclosed. Reinforcement materials may include fibers and/or particles that are incorporated in various elements of light-emitting devices to provide improved mechanical strength, reduced differences in thermal expansion, improved adhesion between various device elements, modified optical characteristics such as modified far field patterns, and/or improved manufacturability. Reinforcement materials may be provided within support elements on which LED chips are mounted. In certain aspects, the support elements may be light-transmissive to light emitted by the LED chips. Reinforcement materials may also be provided in laminate films are that provided on support elements. Such laminate films may provide build-up structures that form cavities for the LED chip, or the laminate films may conformally cover the LED chips.

28 Claims, 13 Drawing Sheets

(51) Int. Cl.

| | |
|---|---|
| *H10H 20/854* | (2025.01) |
| *H10H 20/857* | (2025.01) |
| *H10W 90/00* | (2026.01) |

(52) U.S. Cl.
CPC ....... *H10H 20/857* (2025.01); *H10H 20/0362* (2025.01); *H10H 20/0364* (2025.01)

(58) Field of Classification Search
CPC ... H10H 20/855; H10H 20/856; H10H 20/853
See application file for complete search history.

(56) References Cited

U.S. PATENT DOCUMENTS

| | | | |
|---|---|---|---|
| 2012/0091594 A1* | 4/2012 | Landesberger | ......... H01L 24/20 257/E23.068 |
| 2013/0214300 A1* | 8/2013 | Lerman | .................... F21K 9/64 257/88 |
| 2013/0256711 A1* | 10/2013 | Joo | ........................ H10H 29/10 438/28 |
| 2016/0293811 A1 | 10/2016 | Hussell et al. | |
| 2018/0033929 A1* | 2/2018 | Baike | ................... H10H 20/856 |
| 2018/0076368 A1 | 3/2018 | Hussell | |
| 2019/0082543 A1* | 3/2019 | Weidinger | ........... H05K 3/4644 |
| 2019/0198723 A1* | 6/2019 | Basin | ................ H10H 20/8514 |
| 2019/0295994 A1* | 9/2019 | Nakabayashi | ..... H10H 20/8515 |
| 2020/0013934 A1* | 1/2020 | Jiang | ................ H10H 20/8516 |

FOREIGN PATENT DOCUMENTS

| | | | |
|---|---|---|---|
| KR | 20140128632 A1 | * | 11/2014 |
| KR | 20170055650 A | * | 5/2017 |

* cited by examiner

LIGHT-EMITTING DEVICES WITH REINFORCEMENT MATERIALS AND RELATED METHODS

FIELD OF THE DISCLOSURE

The present disclosure relates to light-emitting devices including solid-state light-emitting devices, light-emitting diodes, and light-emitting diode packages with reinforcement materials and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. LED packages have been developed that can provide mechanical support, electrical connections, encapsulation, and reflective surfaces for directing light emissions for LED emitters in a desired direction. Light emissions that exit surfaces of LED emitters may interact with various elements or surfaces of corresponding LED packages before escaping. As LED package structures continue to evolve for modern applications, challenges remain in producing high quality light with desired emission characteristics, particularly as overall LED package sizes continue to be miniaturized.

The art continues to seek improved LEDs and solid-state lighting devices having desirable illumination characteristics capable of overcoming challenges associated with conventional lighting devices.

SUMMARY

Aspects disclosed herein relate to light-emitting devices including solid-state light-emitting devices, light-emitting diodes (LEDs), and LED packages with reinforcement materials and related methods. Reinforcement materials may include fibers and/or particles that are incorporated in various elements of light-emitting devices to provide improved mechanical strength, reduced differences in thermal expansion, improved adhesion between various device elements, modified optical characteristics such as modified far field patterns, and/or improved manufacturability. Reinforcement materials may be provided within support elements on which LED chips are mounted. In certain aspects, the support elements may be light-transmissive to light emitted by the LED chips. Reinforcement materials may also be provided in laminate films that are provided on support elements. Such laminate films may provide build-up structures that form cavities for the LED chips, or the laminate films may conformally cover the LED chips.

In one aspect, a light-emitting device comprises: one or more light-emitting diode (LED) chips; and a support element on which the one or more LED chips are mounted, wherein the support element is configured to be light-transmissive to wavelengths of light generated by the one or more LED chips, and the support element comprises a plurality of reinforcement materials embedded in a binder material. In certain embodiments, the plurality of reinforcement materials comprises fibers that include one or more of glass fibers, carbon fibers, and mineral fibers. In certain embodiments, the plurality of reinforcement materials further comprises one or more of glass particles, silica particles, alumina particles, carbon particles, and mineral particles. In certain embodiments, the support element comprises a weight ratio of the fibers in a range from 20% to 80%. In certain embodiments, the fibers form an interlaced weave pattern within the support element. In certain embodiments, the support element comprises a fiber cloth. The plurality of reinforcement materials may comprise one or more of glass particles, silica particles, alumina particles, carbon particles, and mineral particles. The support element may comprise a weight ratio of the one or more of glass particles, silica particles, silica particles, alumina particles, carbon particles, and mineral particles in a range from 50% to less than 100%. In certain embodiments, the support element forms at least one of a filled resin and a build-up film. In certain embodiments, the support element comprises a multiple layer structure. In certain embodiments, the plurality of reinforcement materials is arranged only within exterior layers of the support element. In certain embodiments, the plurality of reinforcement materials is arranged only within an interior layer of the support element. In certain embodiments, the plurality of reinforcement materials comprises a fiber reinforced material and a particle reinforced material, wherein at least one layer of the multiple layer structure comprises the fiber reinforced material and another layer of the multiple layer structure comprises the particle reinforced material.

In another aspect, a light-emitting device comprises: at least one light-emitting diode (LED) chip; a support element that is configured to be light-transmissive to wavelengths of light generated by the at least one LED chip, the at least one LED chip being mounted on a mounting face of the support element; and a laminate film on the support element and laterally surrounding the at least one LED chip on the mounting face, the laminate film comprising a first plurality of first reinforcement materials embedded in a first binder material. In certain embodiments, the at least one LED chip resides within a cavity formed by the support element and the laminate film. The light-emitting device may further comprise an encapsulant that resides within the cavity. In certain embodiments, the encapsulant comprises a light-absorbing material. In certain embodiments, the encapsulant comprises a light-reflecting material. The light-emitting device may further comprise at least one device contact pad on the encapsulant such that the at least one LED chip is arranged between the device contact pad and the support element. In certain embodiments, the at least one device contact pad is electrically coupled to the at least one LED chip by at least one electrically conductive path that extends through the encapsulant. In certain embodiments, the at least one device contact pad is arranged to laterally extend on both the encapsulant and the laminate film. The light-emitting device may further comprise a metal pad arranged between the laminate film and the at least one device contact pad. In certain embodiments, the support element comprises a plurality of second reinforcement materials embedded in a second binder material, wherein the plurality of second reinforcement materials comprises a same material as the plurality of first reinforcement materials. In certain embodiments, the support element comprises a plurality of second reinforcement materials embedded in a second binder material, wherein the plurality of second reinforcement materials comprises a different material from the plurality of first reinforcement materials. In certain embodiments, the plurality of first reinforcement materials comprises one or more of glass fibers, glass particles, silica particles, alumina particles, carbon particles, and mineral particles. In certain embodiments, the at least one LED chip is one of a plurality of LED chips; and a portion of the laminate film is arranged on the support element in a location that is between neighboring pairs of LED chips of the plurality of LED chips. The light-emitting device may further comprise at least one device contact pad on the laminate film, and wherein the at least one device contact pad is electrically coupled to the at least one LED chip by at least one electrically conductive path that extends through the laminate film.

In another aspect, a method comprises: attaching at least one light-emitting diode (LED) chip on a mounting surface of a support element, the support element being configured to be light-transmissive to wavelengths of light generated by the at least one LED chip; and forming a laminate film on the support element and laterally surrounding the at least one LED chip on the mounting surface, the laminate film comprising a first plurality of reinforcement materials embedded in a first binder material. The method may further comprise forming an opening in the laminate film, the opening forming a cavity with the support element such that at least one LED chip resides within the cavity. The method may further forming one or more electrically conductive paths on the at least one LED chip; providing an encapsulant within the cavity such that the encapsulant laterally surrounds the at least one LED chip within the cavity; and planarizing the encapsulant to expose portions of the one or more electrically conducive paths. In certain embodiments, forming the laminate film comprises conformally applying the laminate film on the at least one LED chip and along sidewalls of the at least one LED chip. The method may further comprise: forming one or more electrically conductive paths on the at least one LED chip before forming the laminate film; and planarizing the laminate film to expose portions of the one or more electrically conducive paths.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
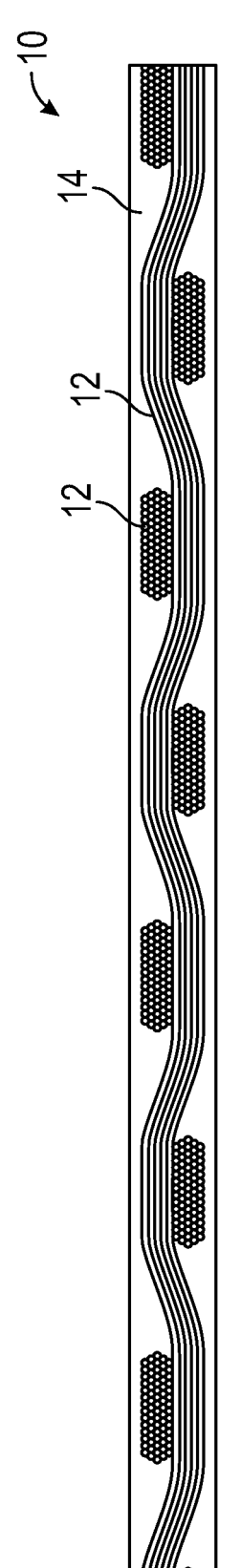
FIG. 1 is a cross-sectional view of an exemplary support element that is reinforced with a fiber according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to light-emitting devices including solid-state light-emitting devices, light-emitting diodes (LEDs), and LED packages with reinforcement materials and related methods. As used herein, light-emitting devices may refer to individual LED packages with groupings of LED chips or LED packages or components with larger arrays of LED chips. Reinforcement materials may include fibers and/or particles that are incorporated in various elements of light-emitting devices to provide improved mechanical strength, reduced differences in thermal expansion, improved adhesion between various device elements, modified optical characteristics such as modified far field patterns, and improved manufacturability. Reinforcement materials may be provided within support elements on which LED chips are mounted. In certain aspects, the support elements may be light-transmissive to light emitted by the LED chips. Reinforcement materials may also be provided in laminate films that are provided on support elements. Such laminate films may provide build-up structures that form cavities for the LED chips, or the laminate films may conformally cover the LED chips.

Before delving into specific details of various aspects of the present disclosure, an overview of various elements that may be included in exemplary LED devices of the present disclosure is provided for context. An LED chip typically comprises an active LED structure or region that can have many different semiconductor layers arranged in various ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In certain embodiments, the active LED structure emits blue light with a peak wavelength range of approximately 430 nanometers (nm) to 480 nm, or green light with a peak wavelength range of 500 nm to 570 nm, or red light with a peak wavelength range of 600 nm to 700 nm. In certain aspects, a single LED package may include multiple LED chips, one or more of which may be configured to provide a different peak wavelength from the other LED chips.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength. In other embodiments, a "light-transmissive" material may be configured with lower values, such as transmitting at least 10%, or at least 25% of light having a desired wavelength, while still being useful for a particular application and suppressing other wavelengths, such as ambient light and/or sunlight. In still further embodiments, the term "light-transmissive" may be used for applications where any useful light, such as emitting wavelengths from an underlying LED, may pass through the material. The terms transparent, reflective, and light-transmissive may be defined relative to certain wavelength ranges, such as those emitted by an LED chip and/or converted by any lumiphoric materials.

As used herein, the term "opaque" refers to materials, surfaces, particles, among others, that are either not transparent or are non-light transmitting over at least a portion of the visible light spectrum. In certain aspects, the term "opaque" may also apply to the entire visible light spectrum. The term "non-light transmitting" may be considered as transmitting less than 20%, or less than 10% of a received light, or certain wavelengths of received light. A material may further be opaque due to either light absorption or light reflection. Some materials may be opaque at certain wavelengths and transparent at others. As a non-limiting example, a red pigment may act as a color filter by absorbing light wavelengths below approximately 600 nm, where it is opaque, while transmitting light wavelengths above approximately 600 nm, where it is transparent.

The present disclosure can be useful for LED chips having a variety of geometries, such as lateral geometries. A lateral geometry LED chip typically includes both anode and cathode connections on the same side of the LED chip that is opposite a substrate, such as a growth substrate. In certain embodiments, a lateral geometry LED chip may be flip-chip mounted such that the anode and cathode connections are on a face of the active LED structure that is opposite the primary emission face of the LED chip. In this configuration, electrical traces or patterns may be provided on a mounting surface for providing electrical connections to the anode and cathode connections of the LED chip. In a flip-chip configuration, the active LED structure is configured between the substrate of the LED chip and the mounting surface. Accordingly, light emitted from the active LED structure may pass through the substrate in a desired emission direction.

As described herein, the principles of the present disclosure are applicable to various embodiments with a variety of LED chip sized, including larger area chips as well as miniature LED chips and micro-LED chips. As used herein, a large area LED chip may have lateral dimensions up to about 2000 microns ($\mu$m), while miniature LED chips may have lateral dimensions around 100 $\mu$m, and micro-LED chips may have lateral dimensions below 50 $\mu$m. In this manner, LED chips of the present disclosure may have lateral dimensions in a range from 20 $\mu$m to 2000 $\mu$m, or in a range from 20 $\mu$m to 100 $\mu$m, or in a range from 100 $\mu$m to 2000 $\mu$m, depending on the application.

According to aspects of the present disclosure, LED packages may include one or more elements, such as lumiphoric materials, encapsulants, light-altering materials, lenses, superstrates or support elements, and electrical contacts, among others, that are provided with one or more LED chips. Light-altering materials may be arranged within LED packages to reflect or otherwise redirect light from the one or more LED chips in a desired emission direction or pattern. The term "superstrate" is used herein as a support element in an LED device, in part, to avoid confusion with other traditional substrates or submounts that may conventionally be part of LED devices, such as a growth or carrier substrate of the LED chip and/or a submount of an LED package. The term "superstrate" is not intended to limit the orientation, location, and/or composition of the structure it describes. In certain embodiments, the superstrate may be composed of a transparent material, a semi-transparent material, or a light-transmissive material to various wavelengths of light provided by an LED chip and/or lumiphoric material.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), metal particles, glass fibers and/or glass particles suspended in a binder, such as silicone or epoxy. In certain aspects, the particles may have an index or refraction that is configured to refract light emissions in a desired direction. In certain aspects, light-reflective particles may also be referred to as light-scattering particles. For light-absorbing materials, the light-altering material may include at least one of carbon, silicon, metal, metal oxides (e.g., iron oxides and the like) and organic particles suspended in a binder, such as silicone or epoxy. Exemplary organic particles may include various pigments, dyes, and/or absorptive additives. Thixotropic materials may include one or more of glass fillers and fumed silica. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray, for absorbing light and increasing contrast. In certain embodiments, the light-altering material includes both light-reflective material and light-absorbing material suspended in a binder. As used herein, a layer or coating of one or more light-altering materials may be referred to as a light-altering coating. In certain embodiments, a light-altering material or coating may be devoid of lumiphoric materials. Light-altering elements may also refer to modified surfaces, such as textures used for diffusion and/or scattering, that do not necessarily require added particles. In still further embodiments, light-altering materials may be provided in the form of coatings that are applied to outer sides or surfaces of light-emitting devices to control light emission.

In certain applications, it is desirable to increase the speed of manufacturing LED devices. One approach to increasing speed of manufacture is to assemble many components on a single support element (or superstrate as described below) and later separate the groups into component arrays. This can be particularly useful when creating multi-color component arrays for use in high-density (HD) video displays. Multiple arrays can be created as a large sheet and subsequently singulated into individual arrays comprising a plurality of LED devices for each singulated portion. In this manner, a single LED device, after singulation, may be populated with multiple LED chips of different emission colors, such as red, green, and blue, among other. In this regard, such LED devices may be well suited for use as pixels within high density video displays and/or signage applications. In other embodiments, larger arrays of LED chips may be formed together to provide LED components, LED tiles, LED screens, and/or LED displays.

Additionally, the elimination of various elements of a conventional LED device may streamline the manufacturing process, improve light quality, promote device miniaturization, and/or reduce costs. For example, LED devices can be assembled without the use of, or devoid of, a conventional LED package submount (e.g., a ceramic submount with traces, a lead frame structure, a printed circuit board, etc.). This may be accomplished by assembling the LEDs topside down, such that the LED is assembled on a support element, such as a transparent superstrate or a light-transmissive layer, which will become a top-side outer surface in the finished product. The components can then be electrically connected through exposed electrical connection points on the opposite side of the LEDs. The device or apparatus may therefore be devoid of a traditional submount on the side of the LEDs opposite the light-transmitting side, such as, for example, a ceramic, metal, or other type of rigid material substrate upon which LEDS are often attached. An LED device built from the topside down as described herein can be considered a complete LED device, which is devoid of such a submount. That is not to say that such LED devices cannot later be assembled into a larger (e.g., multiple component) device, which can, for example, include a traditional package submount.

Support elements according to the present disclosure, such as transparent superstrates and/or light-transmissive layers, may include any number of materials that exhibit light-transmissive properties relative to associated LEDs and/or lumiphoric materials. According to further aspects of the present disclosure, integrity of devices with such support elements may be improved by providing reinforced materials for the support element. In this manner, assembled devices with such support elements may exhibit improved mechanical strength, reduced differences in thermal expansion between device elements, improved adhesion between support elements and other device elements, such as metal contacts, modified optical characteristics such as modified far field patterns, and/or improved manufacturability. Reducing thermal expansion differences, such as in-plane thermal expansion between the support elements and other device portions (e.g., LEDs, encapsulants, etc.) may provide reduced warpage during fabrication which may also improve alignment of other device elements in successive fabrication steps. In this manner, reduced thermal expansion and improved mechanical integrity may provide more robust downstream manufacturing processing steps with reduced structural failures and/or alignment errors. Additionally, reinforced materials for the support element may further provide various optical benefits, such as providing increased light scattering and/or improvements to far-field emission patterns. In still further aspects, such laminate films with similar structures to support elements may be well suited for lamination to form structures around LED chips, such as cavities that may be filled with encapsulants and/or light-altering materials such as light-reflective and/or light-absorbing materials. The laminate films may exhibit light-transmissive properties to light from the LED chips in certain embodiments, while in others, the laminate films may exhibit light-reflecting, light-refracting, light-absorbing, light-scattering, and/or light-diffusing properties.

Exemplary materials for support elements and laminate films may include binder materials of silicones, epoxies, polymers, epoxy-based polymers, epoxy-silicone hybrids, epoxy-polymer hybrids such as epoxy-polyester, benzocyclobutene (BCB) based polymers, and/or polyimides that are embedded with one or more reinforcement materials, such as fibers (e.g., glass fibers, carbon fibers, and mineral fibers) and/or particles (e.g., glass, glass microspheres, glass beads, glass microrods, silica, silica-gel, amorphous silica, fused silica, spherical alumina, aluminum nitride, zirconia dioxide, zinc oxide, titanium dioxide, carbon, and mineral particles, etc.). In certain aspects, such support elements and/or laminate films may be formed by reinforcement materials, such as fibers and/or particles, that are pre-impregnated with binder materials, or prepreg structures that may be provided and assembled in a semi-cured state and fully cured after lamination in a corresponding device. For example, glass fibers pre-impregnated with polymers may be referred to as glass fiber prepregs. Exemplary structures for the support element include reinforced films, cloths, fabrics, and/or build-up films. Loading of reinforcement materials within a binder may vary based on the type of reinforcement material. For example, to provide suitable mechanical properties, loading of fibers and/or particles within a binder for a support element and/or laminate film may comprise a weight ratio of fibers that is in a range from 20% to 80%, or in a range from 40% to 60%. Alternatively, for when reinforcement materials are particles that are other than fibers, loading of such particles within a binder for a support element and/or laminate film may comprise a weight ratio of particles that is in a range from 50% to less than 100%, or in a range from 75% to less than 100%, or in a range from 90% to 100%. Higher weight ratios of particles, such as from 90% to less than 100% may require a sufficient particle size distribution such that enough smaller sized particles are present to fill in gaps formed by larger particles. Highest fill loading of reinforcement materials may be as high as three to four times the binder weight, so that at least 80% of the entire material is reinforcement materials.

FIG. 1 is a cross-sectional view of an exemplary support element 10, or superstrate, that is reinforced with a fiber according to principles of the present disclosure. The support element 10 may comprise a plurality of reinforcement materials 12 that are embedded in a binder material 14. The reinforcement materials 12 may comprise fibers that are arranged within the binder material 14 to provide various mechanical and/or optical properties as described above. In certain embodiments, the support element 10 may embody a fiber fabric, or a stack of fiber fabric layers that are pressed together and enclosed by the binder material 14. In the cross-sectional view of FIG. 1, one of the reinforcement materials 12 is illustrated as extending continuously from left-to-right within the support element 10, while a number of the other reinforcement materials 12 may extend in other directions within the support element 10 such that the view provided in FIG. 1 shows cross-sections of the other reinforcement materials 12. In certain embodiments, these other reinforcement materials 12 may be positioned above and below various portions of the left-to-right oriented reinforcement material 12 to form a weave pattern of interlacing fibers within the support element 10. In other embodiments, all of the reinforcement materials 12 may extend in random directions through the support element 10.

Figure 2:
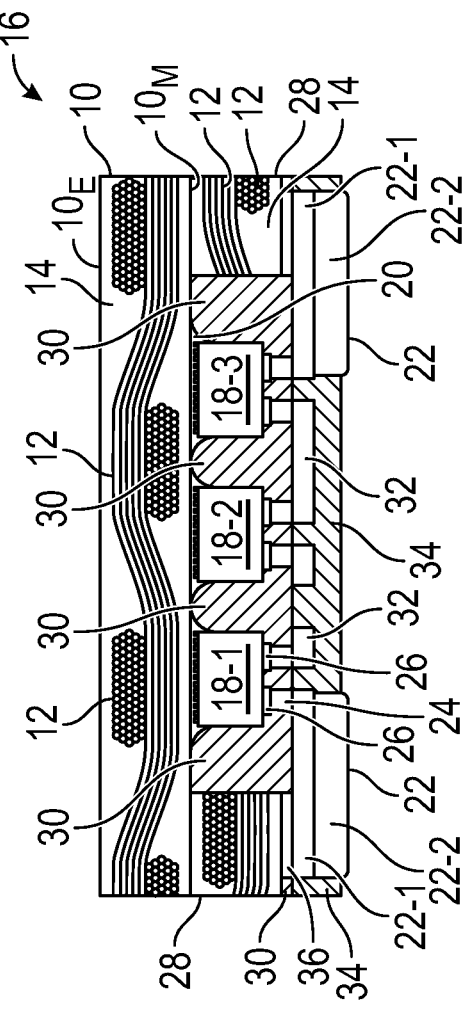
FIG. 2 is a cross-sectional view of a light-emitting device that includes the support element of FIG. 1.

FIG. 2 is a cross-sectional view of a light-emitting device 16 that includes the support element 10 of FIG. 1. A plurality of LED chips 18-1 to 18-3 are mounted to a mounting face $10_M$ of the support element 10. The LED chips 18-1 to 18-3 may be configured to emit the same or different wavelengths of light, depending on the embodiment. By way of example, for display applications where the light-emitting device 16 forms a display pixel, the LED chip 18-1 may be configured to emit blue light, the LED chip 18-2 may be configured to emit green light, and the LED chip 18-3 may be configured to emit red light. Other color combinations, inclusive of white emissions, may be provided depending on the application. Depending on the application, the LED chips 18-1 to 18-3 may comprise various lateral dimensions, such as in a range from 20 μm to 2000 μm, or in a range from 20 μm to 100 μm, or in a range from 100 μm to 2000 μm. Miniature LED chips (e.g., around 100 μm to 300 μm+/−50 μm) and micro-LED chips (e.g., below 100 μm) may be well suited for pixels in LED displays.

The support element 10 may be configured to be light-transmissive and/or light-transparent to the wavelengths of light provided by the LED chips 18-1 to 18-3. The LED chips 18-1 to 18-3 may be mounted to the support element 10 by way of a die attach-layer 20 that may be continuous or discontinuous across the mounting face $10_M$ of the support element 10. The die-attach layer 20 may be light-transmissive to wavelengths of light generated by the LED chips 18-1 to 18-3, with exemplary materials including silicone and/or epoxy. The arrangement of the LED chips 18-1 to 18-3 relative to the support element 10 is provided such that light from the LED chips 18-1 to 18-3 may pass through the support element 10 and out of a primary emission face $10_E$ of the support element 10 that is opposite the mounting face $10_M$.

In certain embodiments, electrical connections for the LED chips 18-1 to 18-3 may be provided on sides of the LED chips 18-1 to 18-3 that are opposite the support element 10. Stated differently, the LED chips 18-1 to 18-3 may be arranged between the support element 10 and electrical connections for the LED chips 18-1 to 18-3. In this manner, at least a portion of light from the LED chips 18-1 to 18-3 may pass through the support element 10 without interacting with the electrical connections. The electrical connections may include device contact pads 22 that are electrically connected to one or more of the LED chips 18-1 to 18-3 by way of electrically conductive paths 24 that may include, but are not limited to, electrically conductive pedestals, bump bonds, solder material, wires, and vias comprises metals such as gold (Au) and/or copper (Cu). Different electrically conductive paths 24 may be coupled to corresponding ones of chip contact pads 26. The device contact pads 22 may include a single layer or multiple layers (labeled as layers 22-1, 22-2), depending on the arrangement and/or manufacturing sequence. For example, a first layer 22-1 of the device contact pad 22 may include an initial metal deposition that provides direct electrical contact with at least one of the electrically conductive paths 24. A second layer 22-2 of the device contact pad 22 may then be formed on and electrically coupled to the first layer 22-1 to provide the remainder of the device contact pad 22. In certain embodiments, the first and second layers 22-1, 22-2 may comprise a same material or a different material, where different materials may include different stacks of metals that form contacts and/or bond pads. For example, in certain embodiments, the first layer 22-1 comprises titanium (Ti) or alloys thereof and the second layer 22-2 comprises Cu or alloys thereof. In other embodiments, the first layer 22-1 may comprise Ti or alloys thereof while the second layer 22-2 comprises one or more of Cu, nickel (Ni), platinum (Pt), and Au. The second layer 22-2 may comprise a layer stack of Cu, Ni, and Au, such as electroless nickel immersion gold (ENIG). In still further embodiments the first layer 22-1 may not be present.

In certain embodiments, the light-emitting device 16 may include a laminate film 28 that is provided on the mounting face $10_M$ of the support element 10. The laminate film 28 may be arranged to laterally surround the LED chips 18-1 to 18-3 on the mounting face $10_M$ such that the LED chips 18-1 to 18-3 at least partially reside in a cavity formed by the laminate film 28 and the support element 10. The laminate film 28 may be bonded to the support element 10 by various compression bonding and/or lamination techniques. In certain embodiments, the laminate film 28 and the support element 10 may both comprise the reinforcement materials 12 embedded in the binder material 14. In this regard, the laminate film 28 and the support element 10 may be formed of the same material, such as a glass fiber prepreg or a glass fiber cloth among other examples. In certain embodiments, the laminate film 28 may be formed to be opaque or even light-reflective to emissions from the LED chips 18-1 to 18-3 while the support element 10 may be configured to be light-transmissive to such emissions. In this regard, the laminate film 28 may have a color that appears black or grey when configured to be opaque or white when configured to be light-reflective. In certain embodiments, only one of the laminate film 28 and the support element 10 may comprise the reinforcement materials 12.

With continued reference to FIG. 2, an encapsulant 30 may be provided that encapsulates the LED chips 18-1 to 18-3 within the cavity formed by the laminate film 28 and the support element 10. The encapsulant 30 may laterally surround sides of the LED chips 18-1 to 18-3 and be arranged between adjacent ones of the LED chips 18-1 to 18-3. As illustrated, the encapsulant 30 may not be provided between the LED chips 18-1 to 18-3 and the support element 10 such that at least some light from the LED chips 18-1 to 18-3 may pass through the support element 10 without passing through the encapsulant 30. The encapsulant 30 may be applied by any coating or dispensing approach as described herein or otherwise known in the art, such as dispensing, molding, stenciling, screen printing, spinning, spraying, powder-coating, slit coating, etc. The encapsulant 30 may comprise one or more of epoxy, epoxy-polyester hybrid, aliphatic urethane, TGIC polyester, non-TGIC polyester, silicone, silicone-modified polyester, silicone hybrid, silicone-epoxy hybrid, acrylic, polycarbonate, or any suitable combinations thereof. In certain embodiments, the encapsulant 30 may be used to control the light output of the light-emitting device 16. For example, the encapsulant 30 may include electrically insulating and non-reflective, opaque, or light-absorbing materials, such as grey, dark, or black materials or particles. For the purposes of the disclosure herein, a non-reflective or light-absorbing material may be defined as a material or surface that does not reflect or redirect the majority of light impinging upon it. For applications where high contrast is desired between the LED chips 18-1 to 18-3, such as one-sided video displays, black or dark-colored encapsulants may be preferable. In alternative applications, the encapsulant 30 may be a clear material, which may be used, for example, in two-sided video displays or transparent displays such as "heads-up" displays. In still further applications, the encapsulant 30 may comprise a light-reflective and/or light-refractive material, such as a white material or white particles, that re-directs laterally emitting light from the LED chips 18-1 to 18-3 toward the support element 10. The encapsulant 30 may be particularly useful for controlling light output in the far field. The encapsulant 30 may further include multiple layers comprising the same or different materials and/or colors. For example, the encapsulant 30 can be formed of a white layer and a black layer.

One or more metal traces 32 may be arranged that electrically couple certain ones of the LED chips 18-1 to 18-3 together. The metal traces 32 may be patterned or otherwise formed concurrently with the first layer 22-1 of the device contact pads 22. In such embodiments, the second layer 22-2 may then form a build-up portion of the device contact pads 22 to provide increased thickness relative to the metal traces 32. The metal traces 32 may form various electrical layouts for the LED chips 18-1 to 18-3, such as individually addressable, serial connection, and/or parallel connection layouts. A solder mask 34 may be formed to cover the metal traces 32 while leaving portions of the device contact pads 22 accessible from a bottom of the light-emitting device 16. In certain embodiments, the solder mask 34 may comprise a light-altering material, such as a light-reflective and/or light-refractive material, that is arranged to redirect any downward propagating light from the LED chips 18-1 to 18-3 toward the emission face 10$_E$. As illustrated, the device contact pads 22 may be arranged to laterally extend on both the encapsulant 30 and the laminate film 28. In certain embodiments, portions of the laminate film 28 may include metal pads 36, or metal contacts, that are arranged to receive portions of the device contact pads 22 and provide improved adhesion therebetween. In FIG. 2, the first layer 22-1 may be provided in direct contact with the metal pad 36.

Figures 3, 4:
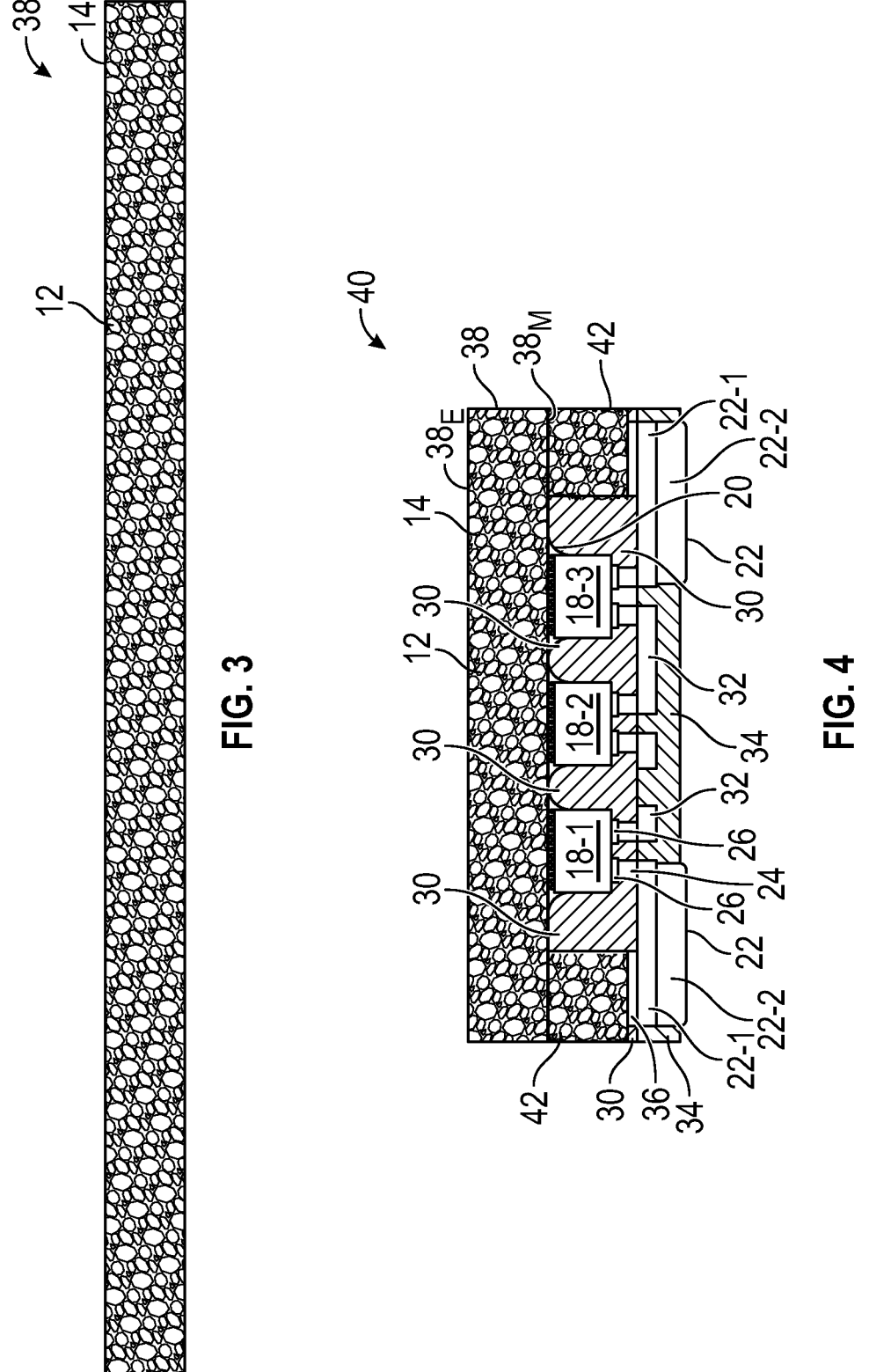
FIG. 3 is a cross-sectional view of an exemplary support element that is similar to the support element of FIG. 1 but is reinforced with particles according to principles of the present disclosure.
FIG. 4 is a cross-sectional view of a light-emitting device that is similar to the light-emitting device of FIG. 2 but includes the support element of FIG. 3.

FIG. 3 is a cross-sectional view of an exemplary support element 38, or superstrate, that is similar to the support element 10 of FIG. 1 but is reinforced with particles or other fillers according to principles of the present disclosure. As with FIG. 1, the support element 38 of FIG. 3 may comprise reinforcement materials 12 that are embedded in a binder material 14. The reinforcement materials 12 in the support element 38 comprise particles that are arranged within the binder material 14 to provide the various mechanical and/or optical properties as described above. The particles may include various materials including one or more of glass, glass microspheres, glass beads, glass microrods, silica, silica-gel, amorphous silica, fused silica, spherical alumina, aluminum nitride, zirconia dioxide, zinc oxide, titanium dioxide, and carbon among others, with a particle size distribution that promotes increased packing of the particles within the support element 38 such that smaller sized particles may fill in gaps around larger sized particles. In certain embodiments, the reinforcement materials 12 may include one or more of glass particles, glass microspheres, glass beads, glass micro-rods, silica particles, silica-gel, amorphous silica, fused silica, spherical alumina, aluminum nitride, zirconia dioxide, zinc oxide, titanium dioxide, and carbon particles. In view of the above, the support element 38 may embody a filled resin, a build-up film, a molding film, and/or molding inks that are configured to provide sufficient light transmissivity without significant color degradation at high temperature use.

FIG. 4 is a cross-sectional view of a light-emitting device 40 that is similar to the light-emitting device 16 of FIG. 2 but includes the support element 38 of FIG. 3. As with previous embodiments, the support element 38 may be configured to be light-transmissive and/or light-transparent to the wavelengths of light provided by the LED chips 18-1 to 18-3. The arrangement of the LED chips 18-1 to 18-3 being provided on the mounting face 10$_M$ of the support element 38 is provided such that light from the LED chips 18-1 to 18-3 may pass through the support element 38 and out of a primary emission face 38E. In certain embodiments, the light-emitting device 40 may include a laminate film 42 that is provided in a similar manner as the laminate film 28 of FIG. 2. In this regard, the laminate film 42 may be arranged to laterally surround the LED chips 18-1 to 18-3 on a mounting face 38M such that the LED chips 18-1 to 18-3 reside in a cavity formed by the laminate film 42 and the support element 38. The laminate film 42 may be bonded to the support element 38 by various compression bonding and/or lamination techniques such as vacuum pressing or by way of a membrane laminator. In certain embodiments, the laminate film 42 and the support element 38 may both comprise the same material described above for FIG. 3. In this regard, the laminate film 42 and the support element 38 may be formed of the same material, such as a filled resin or a build-up film comprising reinforcement materials 12 in the form of particles that are arranged within the binder material 14 to provide the various mechanical and/or optical properties as described above. In other embodiments, only one of the laminate film 42 and the support element 38 may comprise the reinforcement materials 12.

Figures 5A, 5B:
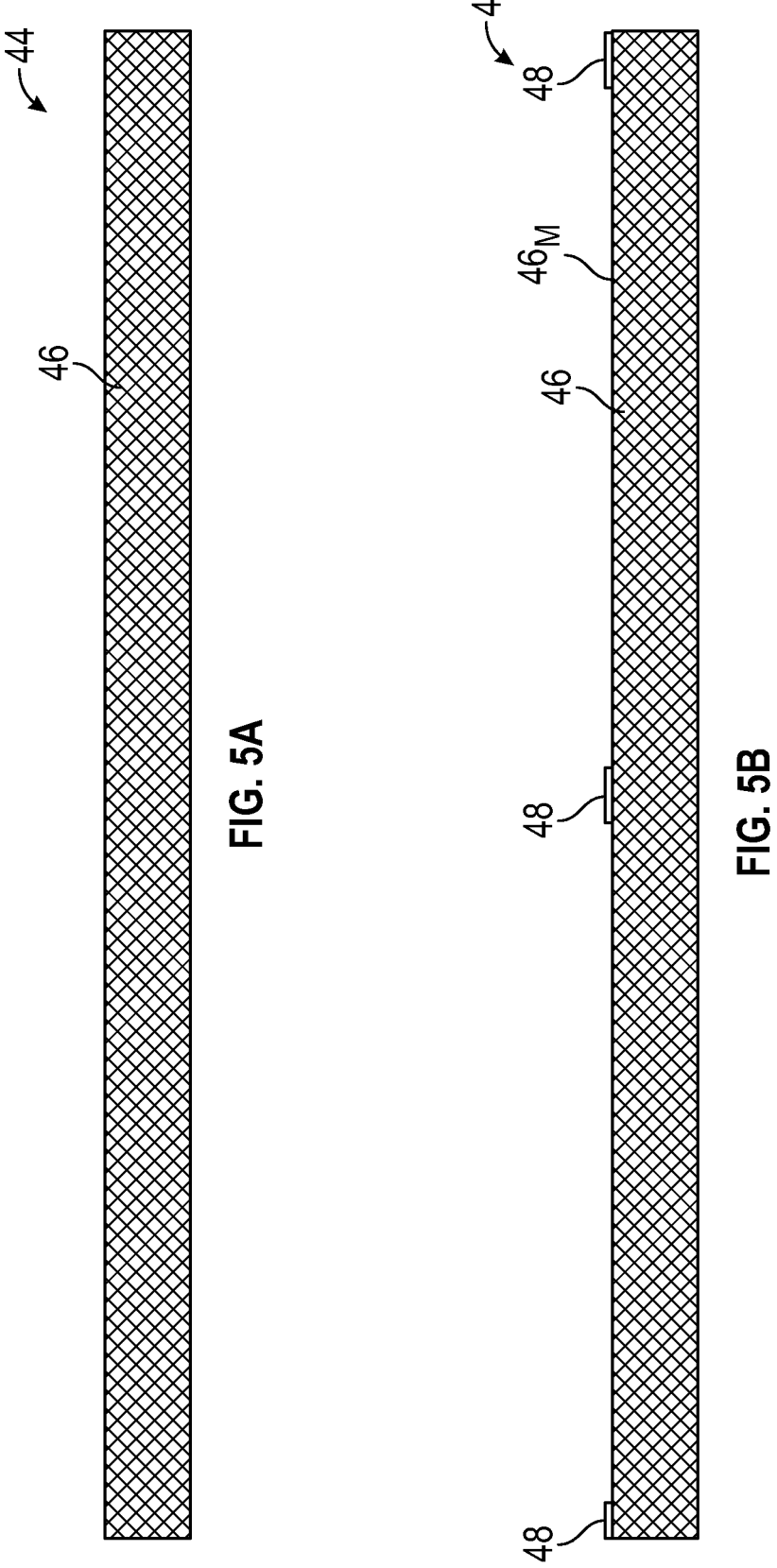
FIG. 5A illustrates a cross-sectional view of a support element at an initial fabrication step for light-emitting devices according to principles of the present disclosure.
FIG. 5B illustrates a cross-sectional view of the support element of FIG. 5A at a subsequent fabrication step for the light-emitting devices where alignment markers are added to the support element.

FIGS. 5A to 5H illustrate cross-sectional views at different fabrication steps for light-emitting devices 44 according to principles of the present disclosure. The light-emitting devices 44 may be similar to either the lighting device 16 of FIG. 2 or the light-emitting device 40 of FIG. 4. In this manner, a support element 46 as illustrated in FIG. 5A for the light-emitting devices 44 may comprise either the support element 10 of FIG. 1 or the support element 38 of FIG. 3. In FIG. 5B, alignment markers 48 may be formed on a mounting face 46$_M$ of the support element 46. The alignment markers 48 may form an alignment grid on the support element 46 that defines locations for individual ones of the light-emitting devices 44 after singulation. In this regard, the alignment markers 48 may be registered with singulation streets between individual light-emitting devices 44. While FIGS. 5A to 5H are provided in the context of forming individual light-emitting devices 44, the principles disclosed are readily applicable to embodiments where larger arrays of LED chips 18-1 to 18-3 are provided in a single device. For example, the principles described for FIGS. 5A to 5H may be employed to form light-emitting devices such as larger LED components having multiple ones of the LED chips 18-1 to 18-3 in an array layout, light-emitting tiles, or even LED screens or displays where the LED chips 18-1 to 18-3 form pixels thereof.

Figures 5C, 5D:
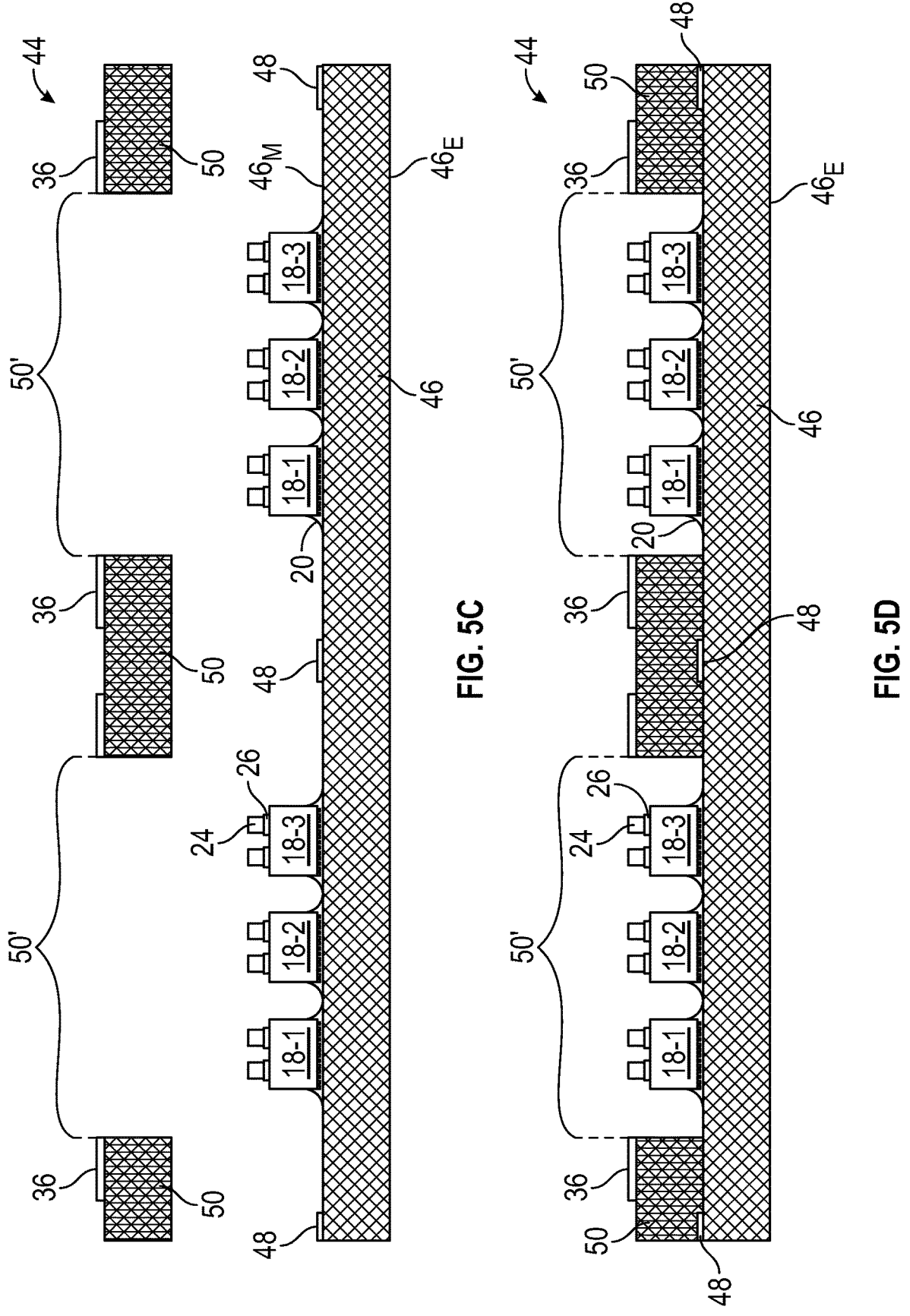
FIG. 5C illustrates a cross-sectional view at a subsequent fabrication step to FIG. 5B where light-emitting diode (LED) chips are mounted on the support element and a laminate film with openings is arranged for to the support element.
FIG. 5D illustrates a cross-sectional view at a subsequent fabrication step to FIG. 5C where the laminate film is mounted to the support element such that the LED chips reside within the openings.

In FIG. 5C, the plurality of LED chips 18-1 to 18-3 are mounted between the alignment markers 48 on the mounting face 46$_M$ of the support element 46 by way of the die-attach layer 20. For illustrative purposes, two groups of the LED chips 18-1 to 18-3 are illustrated that correspond with two light-emitting devices 44. In practice, large numbers of the light-emitting devices 44 may be formed concurrently across a bulk material of the support element 46 before singulation. As further illustrated in FIG. 5C, a laminate film 50 is arranged for positioning over the support element 46. Depending on the embodiment, the laminate film 50 may be a same material or a different material than the support element 46. In certain embodiments, the laminate film 50 may be the same as either the laminate film 28 of FIG. 2 or the laminate film 42 of FIG. 4. As illustrated, the laminate film 50 may be formed with openings 50' that correspond with or are registered with different groupings of the LED chips 18-1 to 18-3. In certain embodiments, the metal pads 36 that promote improved adhesion may be pre-formed on the laminate film 50. In FIG. 5D, the laminate film 50 is attached to the support element 46 by lamination and/or compression molding and the openings 50' form portions of cavities in which the LED chips 18-1 to 18-3 reside.

Figures 5E, 5F:
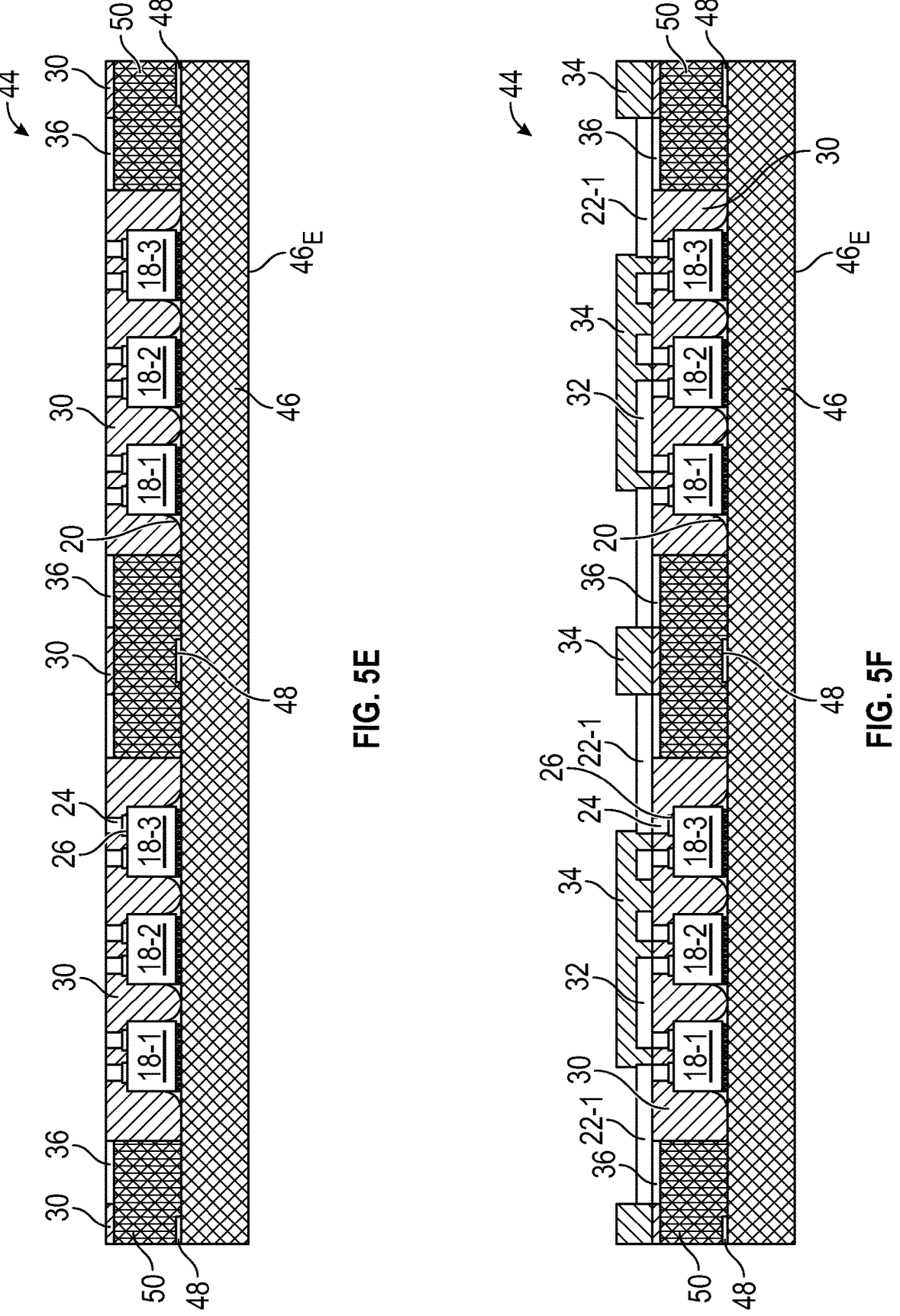
FIG. 5E illustrates a cross-sectional view at a subsequent fabrication step to FIG. 5D where an encapsulant is provided within the openings.
FIG. 5F illustrates a cross-sectional view at a subsequent fabrication step to FIG. 5E where metal traces, portions of device contact pads, and a solder mask are provided.

In FIG. 5E, the encapsulant 30 is formed on the support element 46 in a manner that the openings 50' of FIG. 5D are filled with the encapsulant 30. In this regard, the LED chips 18-1 to 18-3 may also be encapsulated within the cavities formed by the support element 46 and the laminate film 50. In certain embodiments, the encapsulant 30 may be formed on surfaces of the laminate film 50, including between the metal pads 36. A planarization step may also be performed to planarize surfaces of the encapsulant 30 such that portions of the electrically conductive paths 24 to each of the LED chips 18-1 to 18-3 are accessible. In certain embodiments, the planarization step may be performed such that surfaces of the encapsulant 30 are coplanar with surfaces of the electrically conductive paths 24.

Figures 5G, 5H:
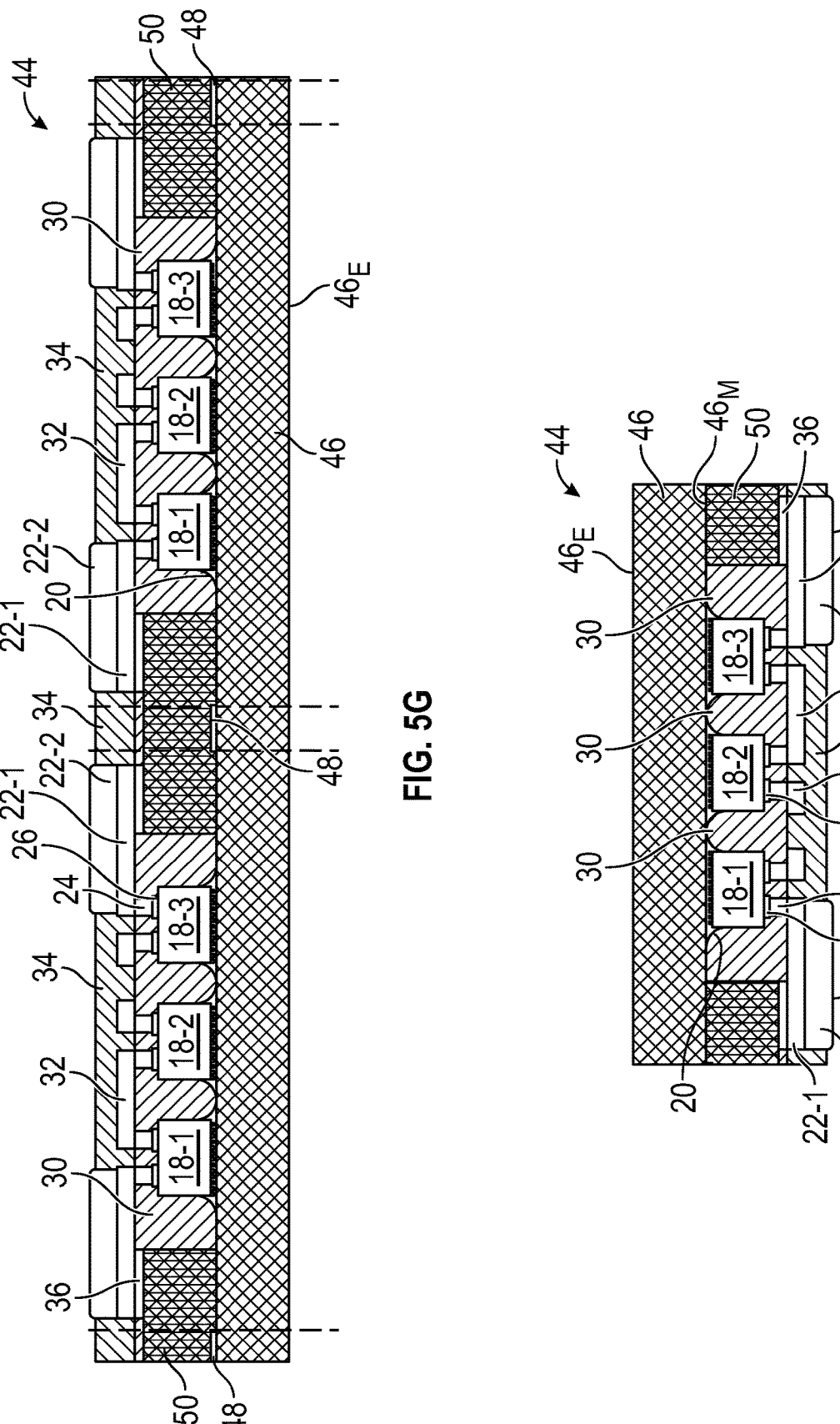
FIG. 5G illustrates a cross-sectional view at a subsequent fabrication step to FIG. 5F where the remainder of the device contact pads are formed and superimposed dashed lines indicate separation lines for individual ones of the light-emitting devices.
FIG. 5H illustrates a cross-sectional view at a subsequent fabrication step to FIG. 5F where an individual light-emitting device has been singulated.

In FIG. 5F, the first layer 22-1 of the device contact pad 22 and the metal traces 32 may first be patterned, followed by formation of the solder mask 34 that covers everything but portions of the first layer 22-1. As illustrated in FIG. 5G, the second layer 22-2 of the device contact pad 22 is formed on the first layer 22-1. As further illustrated in FIG. 5G, superimposed vertical dashed lines are provided that indicate singulation lanes for separating the individual light-emitting devices 44. The singulation lanes, or dicing streets, may be aligned with the alignment markers 48. FIG. 5H illustrates a cross-sectional view of a single light-emitting device 44 after singulation. Additionally, the orientation of the light-emitting device 44 in FIG. 5H is inverted from FIGS. 5A to 5G to indicate the in-use mounting arrangement where the device contact pads 22 may be mounted to external electrical connections, such as traces of a printed circuit board, and an emission face 46$_E$ of the support element 46 is a primary emission face of the light-emitting device 44. In certain embodiments, the encapsulant 30 may be light-transmissive to light from the LED chips 18-1 to 18-3. In other embodiments, the encapsulant 30 may include light-altering particles that are opaque or have black pigments to provide increased contrast between the LED chips 18-1 to 18-3. In still further embodiments, the encapsulant 30 may be loaded with light-altering particles in a manner that provides the encapsulant 30 as opaque, such as transmitting less than 20%, or less than 10% of light emitted from the LED chips 18-1 to 18-3. Additionally, the laminate film 50 may also include light-altering particles that are opaque or have black pigments for increased contrast.

FIGS. 6A to 6F illustrate cross-sectional views at different fabrication steps for light-emitting devices 52 that are similar to the light-emitting device 44 of FIG. 5H, but where the laminate film 28 of FIG. 2 is conformally applied on the LED chips 18-1 to 18-3 and the support element 46 according to principles of the present disclosure. For illustrative purposes, the laminate film 28 of FIG. 2 is illustrated. In this regard, the laminate film 28 may embody a fiber prepreg and/or a fiber cloth. As will be later described with regard to FIGS. 7A to 7E, the fabrication sequence illustrated in FIGS. 6A to 6F may also be applicable to the laminate film 42 of FIG. 4, in the form of a filled resin or a build-up film. While FIGS. 6A to 6F and FIGS. 7A to 7E are provided in the context of forming individual light-emitting devices, the principles disclosed are readily applicable to embodiments where larger arrays of LED chips 18-1 to 18-3 are provided in a single device. For example, the principles described for FIGS. 6A to 6F may be employed to form light-emitting devices such as larger LED components having multiple ones of the LED chips 18-1 to 18-3 in an array layout, light-emitting tiles, or even LED screens or displays where the LED chips 18-1 to 18-3 form pixels thereof.

Figures 6A, 6B:
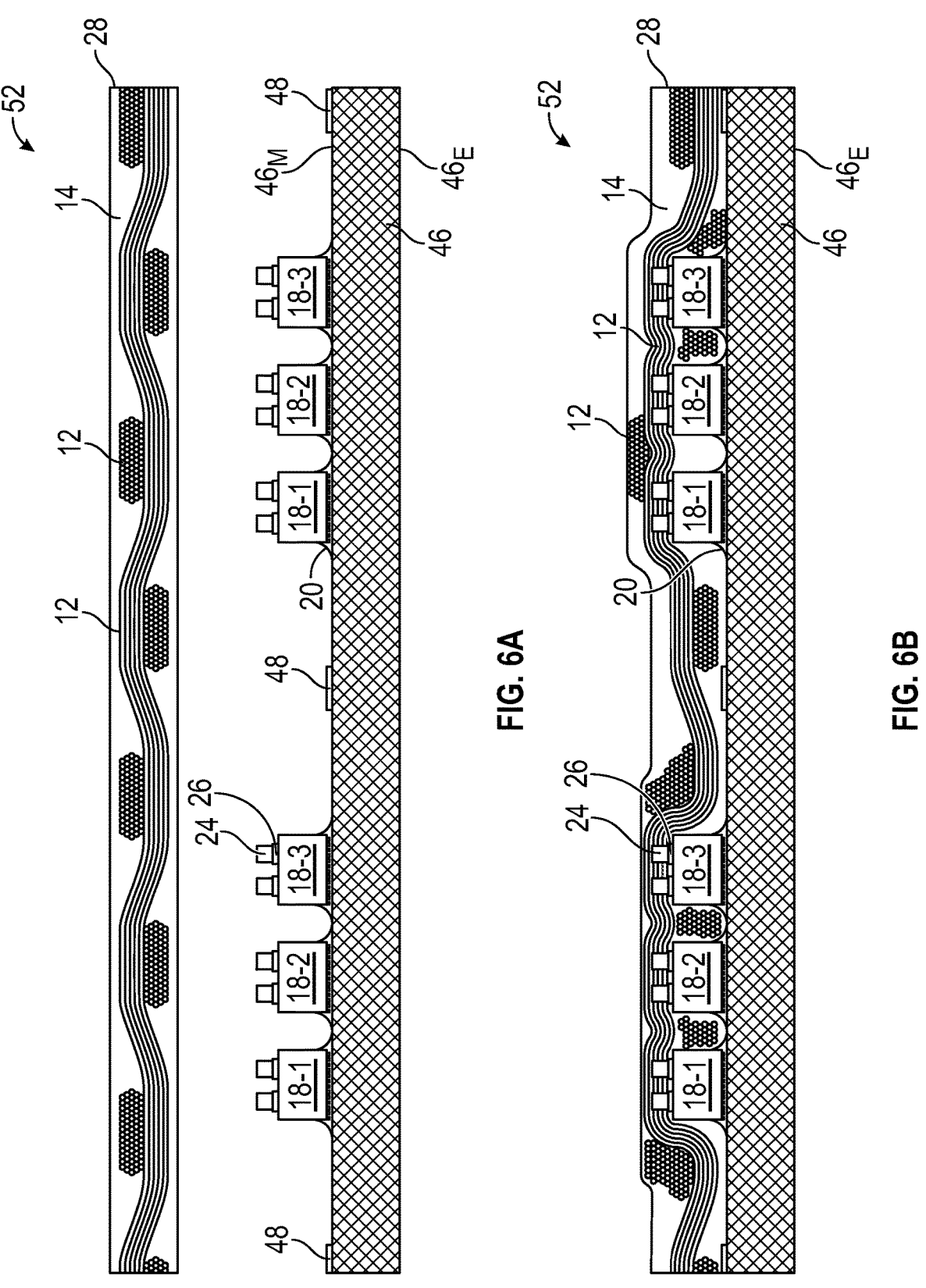
FIG. 6A illustrates a cross-sectional view of a fiber reinforced laminate film above a support element with LED chips at an initial fabrication step arranged for light-emitting devices according to another fabrication sequence.
FIG. 6B illustrates a cross-sectional view at a subsequent fabrication step to FIG. 6A where the laminate film is provided on the support element and the LED chips in a conformal manner.
Figures 6C, 6D:
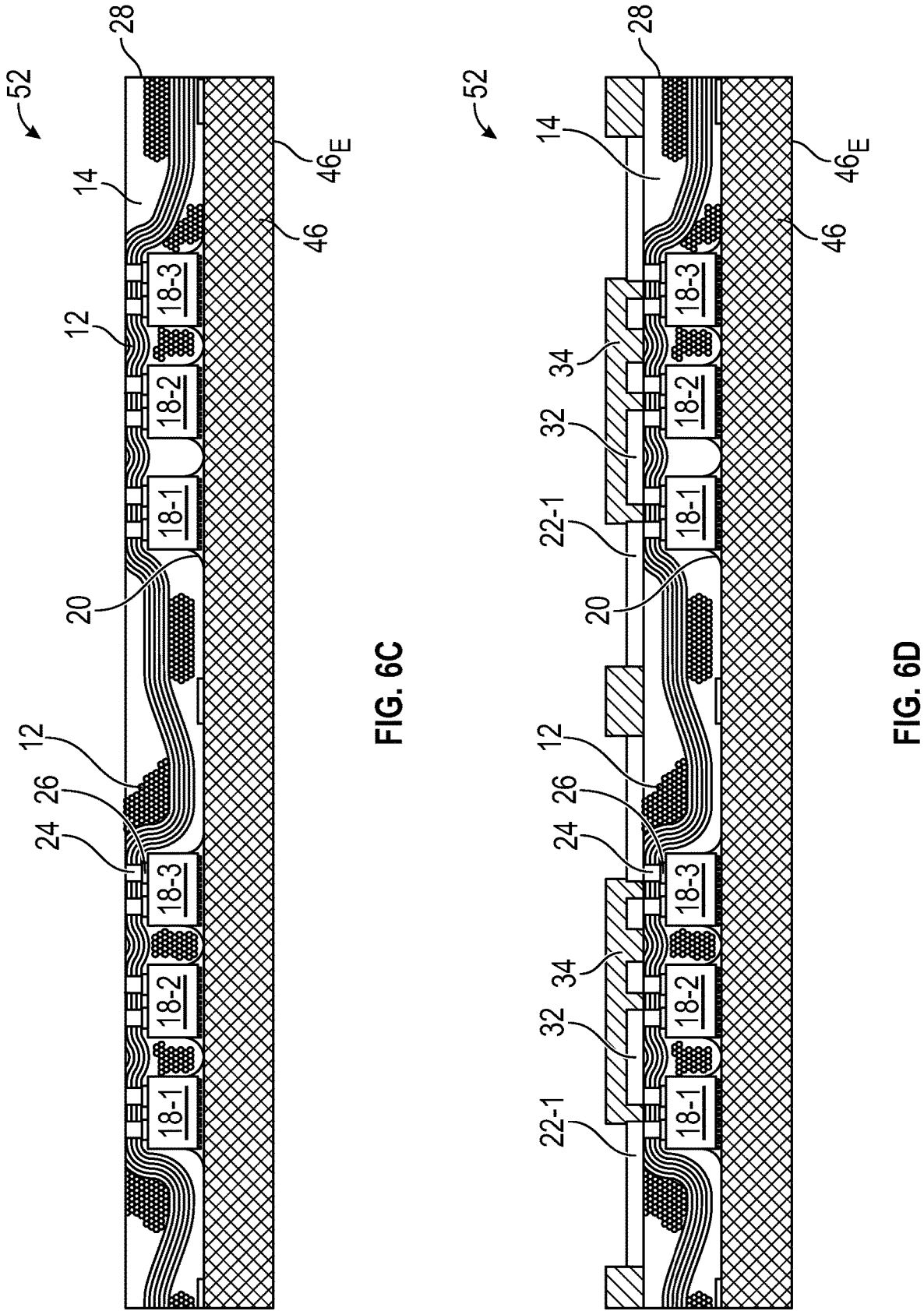
FIG. 6C illustrates a cross-sectional view at a subsequent fabrication step to FIG. 6B where the laminate film has been planarized to expose portions of electrically conductive paths to each of the LED chips.
FIG. 6D illustrates a cross-sectional view at a subsequent fabrication step to FIG. 6C where metal traces, portions of device contact pads, and a solder mask are provided.

FIG. 6A illustrates a cross-sectional view of a fabrication step that is similar to FIG. 5C, but where the laminate film 28 is not preformed with openings that correspond to the different groupings of the LED chips 18-1 to 18-3. Rather, the laminate film 28 is provided in a continuous manner relative to the underlying support element 46. In FIG. 6B, the laminate film 28 is laminated in a conformal manner to cover the LED chips 18-1 to 18-3 and the support element 46. Notably, portions of the laminate film 28 conform to sidewalls of the LED chips 18-1 to 18-3 such that the cavities that house the encapsulant 30 of FIG. 5E are not formed. Instead, the laminate film 28 covers the LED chips 18-1 to 18-3 and fills spaces between neighboring pairs of the LED chips 18-1 to 18-3 to serve as encapsulation for the LED chips 18-1 to 18-3. In such embodiments, the laminate film 28 may be applied with force from a flexible membrane and a vacuum. In other embodiments, the laminate film 28 may be applied with pressure from an inflexible surface, such as a block or a hard plate, with or without a vacuum present, and a top surface of the laminate film 28 may be planar. FIG. 6C illustrates a subsequent fabrication step where the laminate film 28 has been planarized to expose portions of the electrically conductive paths 24 to each of the LED chips 18-1 to 18-3. In certain embodiments, the planarization step may be performed such that surfaces of the laminate film 28 are coplanar with surfaces of the electrically conductive paths 24.

Figures 6E, 6F:
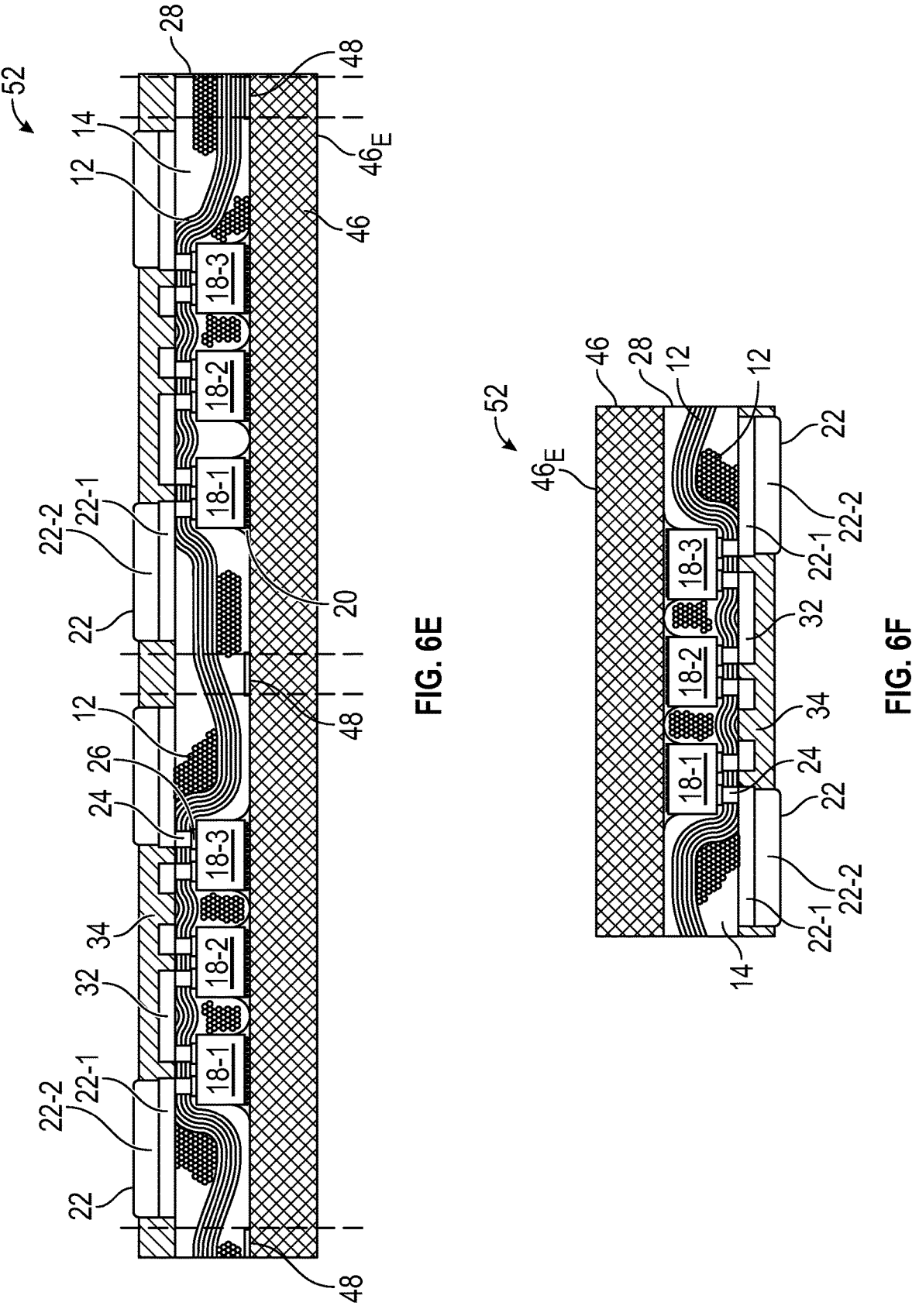
FIG. 6E illustrates a cross-sectional view at a subsequent fabrication step to FIG. 6D where the remainder of the device contact pads are formed and superimposed dashed lines indicate separation lines for individual ones of the light-emitting devices.
FIG. 6F illustrates a cross-sectional view at a subsequent fabrication step to FIG. 6E where an individual light-emitting device has been singulated.

In FIG. 6D, the first layer 22-1 of the device contact pads 22 and the metal traces 32 may first be patterned, followed by formation of the solder mask 34 that covers portions of the metal traces 32 while leaving portions of the first layer 22-1 exposed. As illustrated, the first layer 22-1 of the device contact pads 22 may be formed to laterally extend along portions of the laminate film 28 while also being electrically connected to the electrically conductive paths 24. In certain embodiments, the first layer 22-1 may even be formed directly on portions of the laminate film 28. In FIG. 6E, the second layer 22-2 of the device contact pad 22 may be formed on the first layer 22-1 to build up the device contact pads 22 to a position that is at least planar with or even extends past a thickness of the solder mask 34. Additionally, superimposed vertical dashed lines are provided that indicate singulation lanes for separating the individual light-emitting devices 52. The singulation lanes, or dicing streets, may be aligned with the alignment markers 48. FIG. 6F illustrates a cross-sectional view of a single light-emitting device 52 after singulation. As with FIG. 5H, the orientation of the light-emitting device 52 in FIG. 6F is inverted from FIGS. 6A to 6E to indicate the in-use mounting arrangement where the device contact pads 22 may be mounted to external electrical connections, such as traces of a printed circuit board, and the emission face $46_E$ of the support element 46 is a primary emission face of the light-emitting device 52. In certain embodiments, the laminate film 28 may be light-transmissive to light from the LED chips 18-1 to 18-3. In other embodiments, the laminate film 28 may include light-altering particles that are opaque or have black pigments to provide increased contrast between the LED chips 18-1 to 18-3.

Figures 7A, 7B:
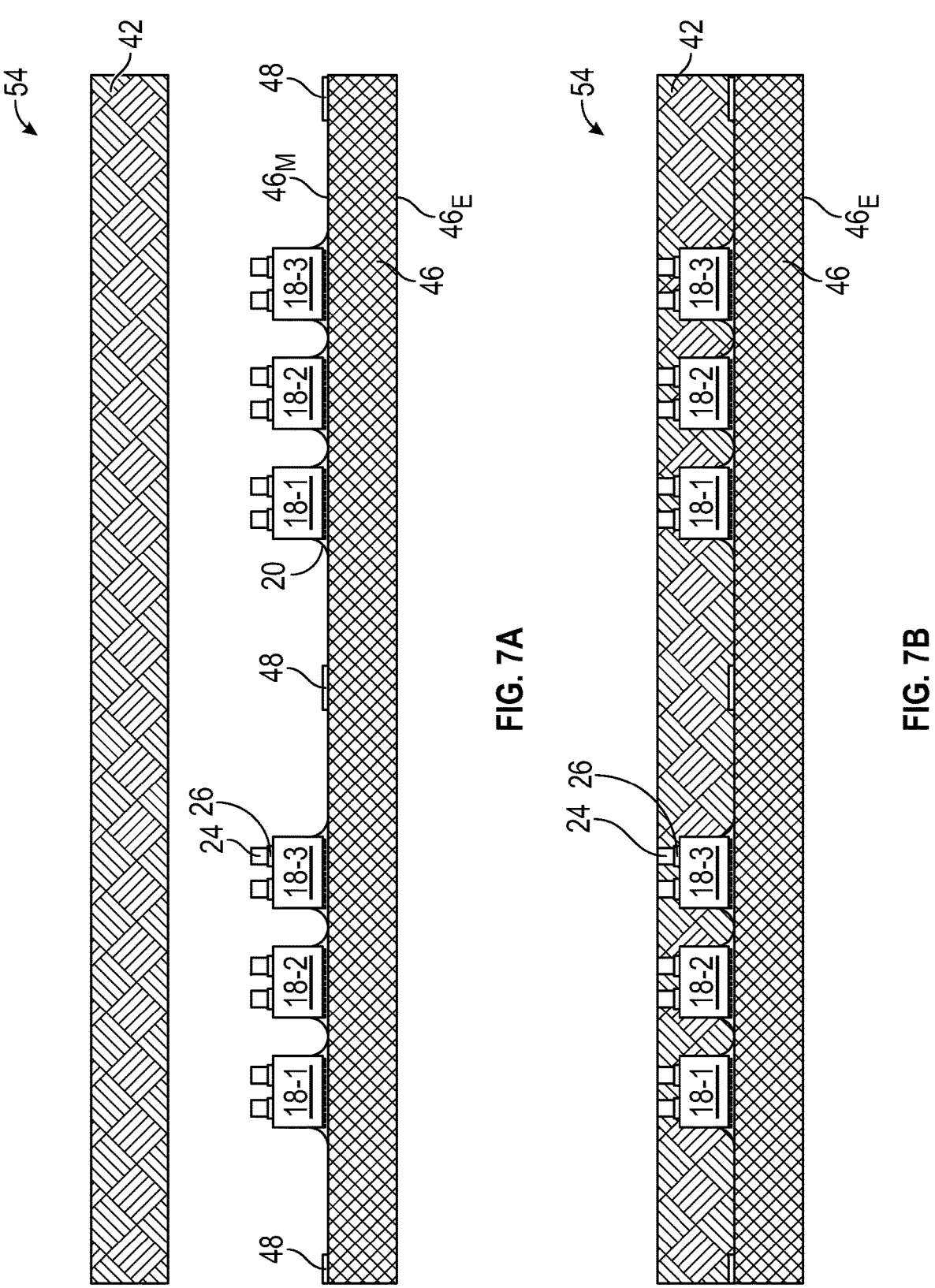
FIG. 7A illustrates a cross-sectional view of a reinforced laminate film above a support element with LED chips at an initial fabrication step arranged for light-emitting devices according to another fabrication sequence.
FIG. 7B illustrates a cross-sectional view at a subsequent fabrication step to FIG. 7A where the laminate film is provided on the support element and the LED chips, and the laminate film has been planarized to expose portions of electrically conductive paths to each of the LED chips.
Figures 7C, 7D:
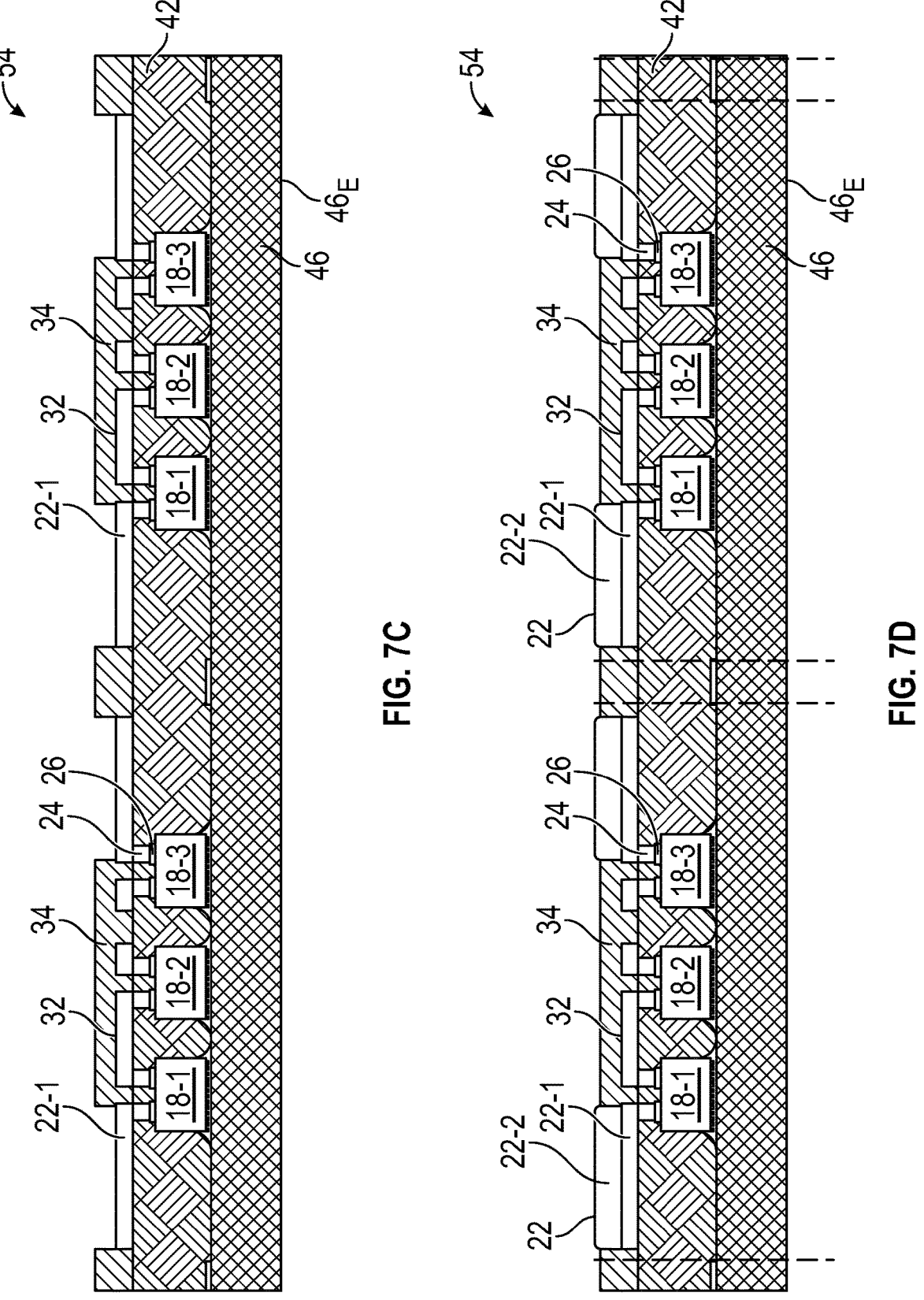
FIG. 7C illustrates a cross-sectional view at a subsequent fabrication step to FIG. 7B where metal traces, portions of device contact pads, and a solder mask are provided.
FIG. 7D illustrates a cross-sectional view at a subsequent fabrication step to FIG. 7C where the remainder of the device contact pads are formed and superimposed dashed lines indicate separation lines for individual ones of the light-emitting devices.

As mentioned above, the fabrication sequence provided by FIGS. 6A to 6F may also be applicable to the laminate film 42 of FIG. 4, in the form of, for example, a filled resin or a build-up film. FIGS. 7A to 7E illustrate cross-sectional views at different fabrication steps for light-emitting devices 54 that are similar to the light-emitting device 52 of FIG. 6F, but where the laminate film 42 is implemented. Accordingly, the description of the fabrication sequence provided for FIGS. 6A to 6F may be equally applicable to FIGS. 7A to 7E, but with the laminate film 42 in place of the laminate film 28. In this manner, the laminate film 42 may be provided in a continuous manner relative to the support element 46 and the LED chips 18-1 to 18-3 as illustrated in FIG. 7A, followed by application and planarization to arrive at the illustration of FIG. 7B, metallization steps as illustrated in FIGS. 7C and 7D, and followed by singulation to arrive at the light-emitting device 54 of FIG. 7E. In certain embodiments, the laminate film 42 may be light-transmissive to light from the LED chips 18-1 to 18-3. In other embodiments, the laminate film 42 may include light-altering particles that are opaque or have black pigments to provide increased contrast between the LED chips 18-1 to 18-3.

Support elements and laminate films as described above may further include multiple layer structures according to principles of the present disclosure. By providing multiple layer structures, mechanical and/or optical properties of the support elements and/or laminate films may be tailored for different applications. FIGS. 8 to 11 illustrate exemplary structures that may be implemented as any of the support elements in FIGS. 1 to 7E, as any of the laminate films in FIGS. 1 to 7E, or as both the support elements and the laminate films in FIGS. 1 to 7E. Additionally, the structures illustrated in FIGS. 8 to 11 may be provided in different combinations of the support elements and the laminate films within any of the embodiments of FIGS. 1 to 7E. For example, an exemplary light-emitting device may include a support element and a laminate film according to one of the structures illustrated in FIGS. 8 to 11. In other embodiments, an exemplary light-emitting device may include a support element according to one of the structures illustrated in FIGS. 8 to 11 and a laminate film according to one of the other structures illustrated in FIGS. 8 to 11.

Figures 7E, 8:
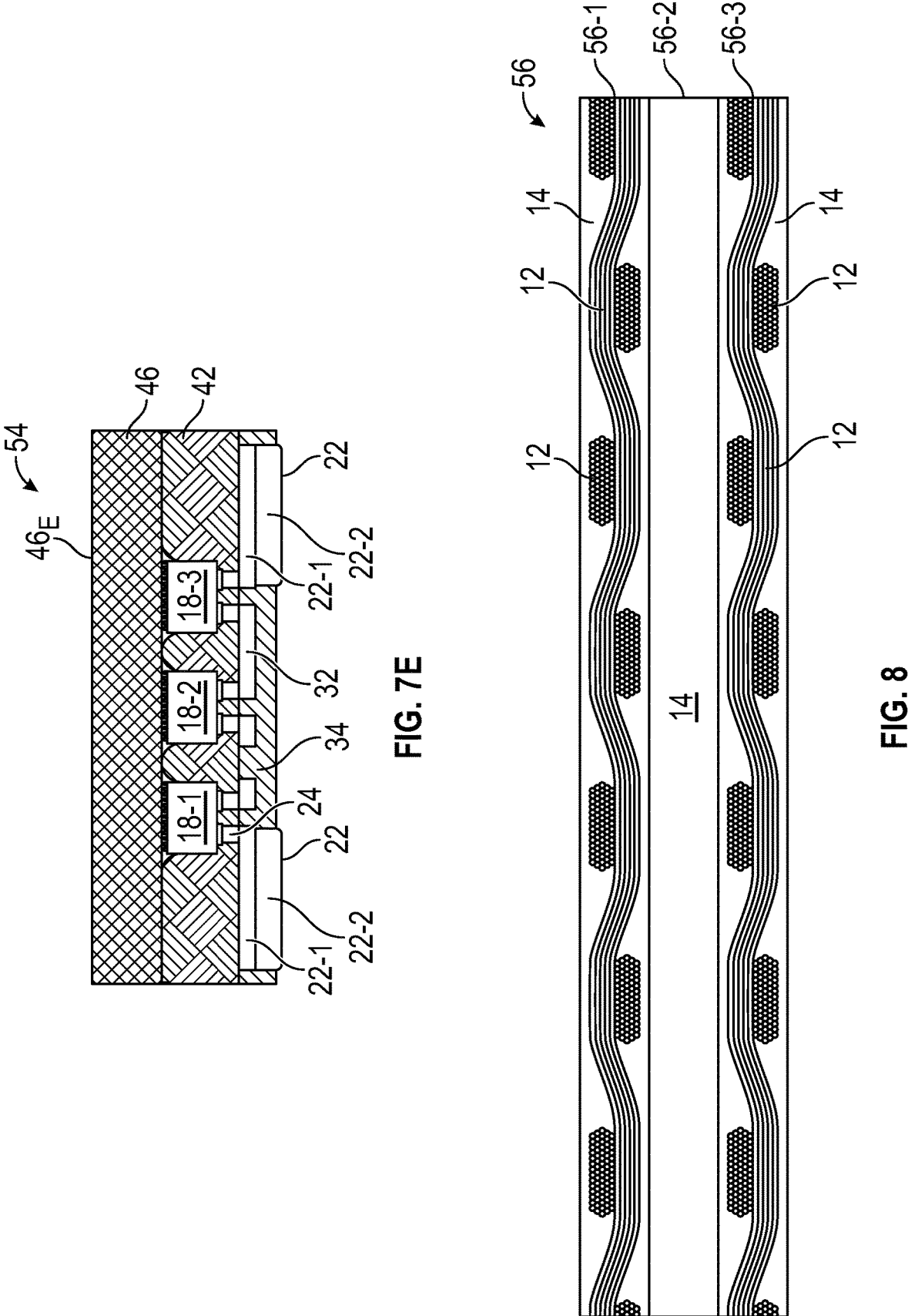
FIG. 7E illustrates a cross-sectional view at a subsequent fabrication step to FIG. 7D where an individual light-emitting device has been singulated.
FIG. 8 illustrates a structure that may be implemented for any of the support elements and/or laminate films of FIGS. 1 to 7E, where the structure includes alternating reinforced layers with a layer that does not include reinforcement materials.

FIG. 8 illustrates a structure 56 that may be implemented for any of the support elements and/or laminate films of FIGS. 1 to 7E, where the structure 56 includes alternating reinforced layers with a layer that does not include reinforcement materials. The structure 56 may include a first layer 56-1 that includes reinforcement materials 12 that are embedded in a binder material 14 as described for the support element 10 of FIG. 1, such as a fiber cloth, film, and/or fiber prepreg. In this regard, the reinforcement materials 12 may comprise fibers that are arranged within the binder material 14 to provide various mechanical and/or optical properties as described above. The structure 56 may further include a second layer 56-2 that is devoid of the reinforcement materials 12, and a third layer 56-3 that includes the reinforcement materials 12 in a similar manner as the first layer 56-1. In certain embodiments, the second layer 56-2 may be formed of the same binder material 14 as the first and third layers 56-1, 56-3, while in other embodiments, the second layer 56-2 may include a different material. As illustrated, the second layer 56-2 may be arranged between the first and third layer 56-1, 56-3, thereby forming an interior layer of the structure 56, while the reinforced first and third layers 56-1, 56-3 form exterior layers and/or surfaces of the structure 56. In still further embodiments, the third layer 56-3 may be omitted if necessary to provide increased symmetry with regard to coefficient of thermal expansion (CTE) balancing between the first and second layers 56-1, 56-2. Additionally, the sequence of the first and second layers 56-1, 56-2 may be repeated any number of times within the structure 56.

Figures 9, 10, 11:
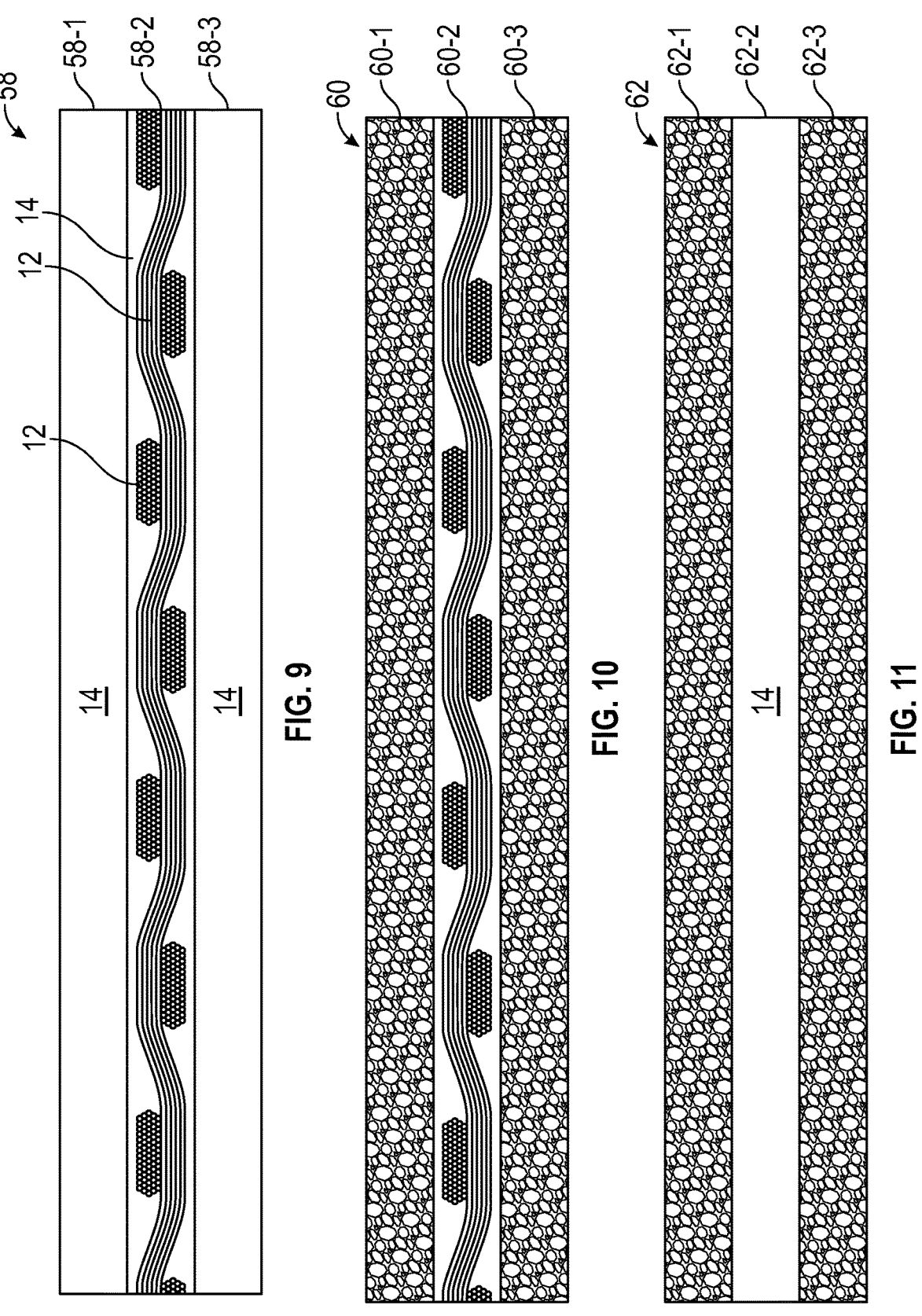
FIG. 9 illustrates a structure that is similar to the structure of FIG. 8, but with an inverse relationship for the arrangement of layers within the structure.
FIG. 10 illustrates a structure that is similar to the structure of FIG. 9, but where the first and third layers are reinforced with particles in a similar manner as described for the support element of FIG. 3.
FIG. 11 illustrates a structure that is similar to the structure of FIG. 10, but where the second layer is devoid of reinforcement materials.

FIG. 9 illustrates a structure 58 that is similar to the structure 56 of FIG. 8, but with an inverse relationship for the layers 58-1 to 58-3. Accordingly, the second layer 58-2 may include the reinforcement materials 12 that are embedded in a binder material 14, while the first and third layers 58-1, 58-3 may be devoid of the reinforcement materials 12. In this manner, the reinforced second layer 56-2 forms an interior layer of the structure 58 while the first and third layers 58-1, 58-3 form exterior layers and/or surfaces. Accordingly, the first and third layers 58-1, 58-3 may be capable of providing smooth top and bottom surfaces for the structure 58. For example, the first and third layers 58-1, 58-3 may be readily planarized by lapping or the like to improve surface smoothness without damage to the embedded second layer 58-2. Additionally, the first and third layers 58-1, 58-3 may more readily accommodate and/or disperse light-absorbing particles, such as black pigments, for embodiments where higher contrast is desired. In still further embodiments, the third layer 58-3 may be omitted if necessary to provide increased symmetry with regard to CTE balancing between the first and second layers 58-1, 58-2. Additionally, the sequence of the first and second layers 58-1, 58-2 may be repeated any number of times within the structure 58.

FIG. 10 illustrates a structure 60 that is similar to the structure 58 of FIG. 9, but where first and third layers 60-1, 60-3 are reinforced with particles in a similar manner as described for the support element 38 of FIG. 3. In this manner, the first and third layers 60-1, 60-3 may embody particle reinforced material, such as a filled resin and/or a build-up film, while a second layer 60-2 may embody a fiber reinforced material. As such, the filled resin and/or build-up film of the first and third layers 60-1, 60-3 form exterior layers and/or surfaces of the structure 60 while the second layer 60-2 forms an interior layer of a fiber reinforced material. With such an arrangement, lower values of coefficient of thermal expansion (CTE) may be achieved by selection of particles of the first and third layers 60-1, 60-3 compared with the selection of fiber reinforced materials of the second layer 60-2. Additionally, the structure of the first and third layers 60-1, 60-3 may improve metal adhesion if irregular surfaces are created during any planarizing step for the first and third layers 60-1, 60-3. By having the ability to select a type of particles and a loading of such particles in the first and third layers 60-1, 60-3 in combination with a selection of a type of fiber and a loading of such fiber in the second layer 60-2, the structure 60 may provide an option where a balance between mechanical and optical properties may be tailored. In still further embodiments, the third layer 60-3 may be omitted if necessary to provide increased symmetry with regard to CTE balancing between the first and second layers 60-1, 60-2. Additionally, the sequence of the first and second layers 60-1, 60-2 may be repeated any number of times within the structure 60.

FIG. 11 illustrates a structure 62 that is similar to the structure 60 of FIG. 10, but where a second layer 62-2 is devoid of reinforcement materials. In this manner, first and third layers 62-1, 62-3 may embody particle reinforced materials, such as a filled resin and/or a build-up film, while the second layer 62-2 may be formed of material that is similar to a binder material of the first and third layers 62-1, 62-3, or of a different material entirely. As such, the filled resin and/or build-up film of the first and third layers 62-1, 62-3 form exterior layers and/or surfaces of the structure 62. By providing a second layer 62-2 that is devoid of reinforcement materials and is sandwiched between the first and third layers 62-1, 62-3, the second layer 62-2 may form an optical cavity for potential light bouncing between the first and third layers 62-1, 62-3. For multiple color embodiments, such as those where the structure 62 is arranged within a light-emitting device with multiple LEDs of different emission colors, the optical cavity may promote increasing color mixing for aggregate emissions that escape the light-emitting device. In still further embodiments, the third layer 62-3 may be omitted if necessary to provide increased symmetry with regard to CTE balancing between the first and second layers 62-1, 62-2. Additionally, the sequence of the first and second layers 62-1, 62-2 may be repeated any number of times within the structure 62.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting device comprising:
one or more light-emitting diode (LED) chips;
a support element comprising a mounting face on which the one or more LED chips are mounted and an emission face that is opposite the mounting face, wherein the support element is configured to be light-transmissive such that the support element is configured to transmit at least 50% of wavelengths of light generated by the one or more LED chips so that a majority of light from the one or more LED chips is configured to exit the support element through the emission face, the support element comprises a plurality of reinforcement materials embedded in a binder material;

wherein the plurality of reinforcement materials comprises fibers that include one or more of glass fibers, carbon fibers, and mineral fibers; and; and
first and second device contact pads electrically coupled to the one or more LED chips, the first and second device contact pads forming mounting locations for receiving external electrical connections, the one or more LED chips being arranged between the support element and the first and second device contact pads; and
a metal pad arranged between the support element and the first device contact pad.

2. The light-emitting device of claim 1, wherein the plurality of reinforcement materials further comprises one or more of glass particles, silica particles, alumina particles, carbon particles, and mineral particles.

3. The light-emitting device of claim 1, wherein the support element comprises a weight ratio of the fibers in a range from 20% to 80%.

4. The light-emitting device of claim 1, wherein the fibers form an interlaced weave pattern within the support element.

5. The light-emitting device of claim 1, wherein the support element comprises a fiber cloth.

6. The light-emitting device of claim 1, wherein the plurality of reinforcement materials comprises one or more of glass particles, silica particles, alumina particles, carbon particles, and mineral particles.

7. The light-emitting device of claim 6, wherein the support element comprises a weight ratio of the one or more of glass particles, silica particles, silica particles, alumina particles, carbon particles, and mineral particles in a range from 50% to less than 100%.

8. The light-emitting device of claim 6, wherein the support element forms at least one of a filled resin and a build-up film.

9. The light-emitting device of claim 8, wherein the support element comprises a multiple layer structure.

10. The light-emitting device of claim 9, wherein the plurality of reinforcement materials is arranged only within exterior layers of the support element.

11. The light-emitting device of claim 9, wherein the plurality of reinforcement materials is arranged only within an interior layer of the support element.

12. The light-emitting device of claim 9, wherein the plurality of reinforcement materials comprises the fiber reinforced material and a particle reinforced material, wherein at least one layer of the multiple layer structure comprises the fiber reinforced material and another layer of the multiple layer structure comprises the particle reinforced material.

13. A light-emitting device comprising:
at least one light-emitting diode (LED) chip;
a support element configured to be light-transmissive such that the support element is configured to transmit at least 50% of wavelengths of light generated by the at least one LED chip, the at least one LED chip being mounted on a mounting face of the support element that is opposite an emission face of the support element so that a majority of light from the at least one LED chip is configured to exit the support element through the emission face;
a laminate film on the support element and laterally surrounding the at least one LED chip on the mounting face, the laminate film comprising a plurality of first reinforcement materials embedded in a first binder material;

wherein the first reinforcement materials comprises fibers that include one or more of glass fibers, carbon fibers, and mineral fibers; and first and second device contact pads electrically coupled to the at least one LED chip, the first and second device contact pads forming mounting locations for receiving external electrical connections, the at least one LED chip being arranged between the support element and the first and second device contact pads; and a metal pad arranged between the laminate film and the first device contact pad.

14. The light-emitting device of claim 13, wherein the at least one LED chip resides within a cavity formed by the support element and the laminate film.

15. The light-emitting device of claim 14, further comprising an encapsulant that resides within the cavity.

16. The light-emitting device of claim 15, wherein the encapsulant comprises a light-absorbing material.

17. The light-emitting device of claim 15, wherein the encapsulant comprises a light-reflecting material.

18. The light-emitting device of claim 15, wherein the first and second device contact pads are electrically coupled to the at least one LED chip by at least one electrically conductive path that extends through the encapsulant.

19. The light-emitting device of claim 15, wherein the first and second device contact pads are arranged to laterally extend on both the encapsulant and the laminate film.

20. The light-emitting device of claim 13, wherein the support element comprises a plurality of second reinforcement materials embedded in a second binder material, wherein the plurality of second reinforcement materials comprises a same material as the plurality of first reinforcement materials.

21. The light-emitting device of claim 13, wherein the support element comprises a plurality of second reinforcement materials embedded in a second binder material, wherein the plurality of second reinforcement materials comprises a different material from the plurality of first reinforcement materials.

22. The light-emitting device of claim 13, wherein:

the at least one LED chip is one of a plurality of LED chips; and a portion of the laminate film is arranged on the support element in a location that is between neighboring pairs of LED chips of the plurality of LED chips.

23. The light-emitting device of claim 13, wherein the first and second device contact pads are electrically coupled to the at least one LED chip by at least one electrically conductive path that extends through the laminate film.

24. A method comprising:

attaching at least one light-emitting diode (LED) chip on a mounting face of a support element that is opposite an emission face of the support element, the support element being configured to be light-transmissive such that the support element is configured to transmit at least 50% of wavelengths of light generated by the at least one LED chip so that a majority of light from the at least one LED chip is configured to exit the support element through the emission face;

forming a laminate film on the support element and laterally surrounding the at least one LED chip on the mounting face, the laminate film comprising a plurality of reinforcement materials embedded in a first binder material;

wherein the plurality of reinforcement materials comprises fibers that include one or more of glass fibers, carbon fibers, and mineral fibers; and forming first and second device contact pads electrically coupled to the at least one LED chip, the first and second device contact pads forming mounting locations for receiving external electrical connections, the at least one LED chip being arranged between the support element and the first and second device contact pads; and forming a metal pad between the laminate film and the first device contact pad.

25. The method of claim 24, further comprising forming an opening in the laminate film, the opening forming a cavity with the support element such that at least one LED chip resides within the cavity.

26. The method of claim 25, further comprising:

forming one or more electrically conductive paths on the at least one LED chip;

providing an encapsulant within the cavity such that the encapsulant laterally surrounds the at least one LED chip within the cavity; and planarizing the encapsulant to expose portions of the one or more electrically conductive paths.

27. The method of claim 24, wherein forming the laminate film comprises conformally applying the laminate film on the at least one LED chip and along sidewalls of the at least one LED chip.

28. The method of claim 27, further comprising:

forming one or more electrically conductive paths on the at least one LED chip before forming the laminate film; and planarizing the laminate film to expose portions of the one or more electrically conductive paths.

*　*　*　*　*